United States Patent
Hara et al.

(10) Patent No.: US 11,417,706 B2
(45) Date of Patent: Aug. 16, 2022

(54) SEMICONDUCTOR STORAGE DEVICE

(71) Applicant: KIOXIA CORPORATION, Tokyo (JP)

(72) Inventors: Hiroyuki Hara, Fujisawa Kanagawa (JP); Yoshinori Suzuki, Chigasaki Kanagawa (JP)

(73) Assignee: KIOXIA CORPORATION, Tokyo (JP)

( * ) Notice: Subject to any disclaimer, the term of this patent is extended or adjusted under 35 U.S.C. 154(b) by 0 days.

(21) Appl. No.: 17/187,626

(22) Filed: Feb. 26, 2021

(65) Prior Publication Data

US 2022/0045129 A1 Feb. 10, 2022

(30) Foreign Application Priority Data

Aug. 6, 2020 (JP) .............................. JP2020-134197

(51) Int. Cl.
*G11C 11/00* (2006.01)
*H01L 27/24* (2006.01)
*G11C 13/00* (2006.01)
*H01L 45/00* (2006.01)

(52) U.S. Cl.
CPC ...... *H01L 27/2463* (2013.01); *G11C 13/0004* (2013.01); *G11C 13/004* (2013.01); *G11C 13/0026* (2013.01); *G11C 13/0069* (2013.01); *H01L 27/2409* (2013.01); *H01L 45/06* (2013.01); *H01L 45/126* (2013.01); *H01L 45/144* (2013.01); *G11C 2213/72* (2013.01)

(58) Field of Classification Search
CPC .............. G11C 13/004; G11C 13/0026; G11C 13/0004
USPC ......................................................... 365/163
See application file for complete search history.

(56) References Cited

U.S. PATENT DOCUMENTS

| | | | |
|---|---|---|---|
| 2003/0235101 A1* | 12/2003 | Tanaka | .............. H01L 27/10885 257/E27.084 |
| 2014/0098594 A1* | 4/2014 | Azuma | .............. G11C 13/0023 365/148 |
| 2019/0050169 A1 | 2/2019 | Komai | |

* cited by examiner

*Primary Examiner* — Vu A Le
(74) *Attorney, Agent, or Firm* — Kim & Stewart LLP

(57) ABSTRACT

A semiconductor storage device includes lower and upper bit lines, word lines between the bit lines, and memory cells between the bit lines and the word lines. The memory cells are divided into logical slices and a memory cell from each logical slice is selected when carrying out a read or write operation. A first logical slice includes memory cells, each of which is between one of two bit lines and one of three word lines that are adjacent to each other. The two bit lines include one lower bit line and one upper bit line. A second logical slice includes memory cells, each of which is between one of three bit lines and one of three word lines that are not adjacent to each other. The three bit lines include one lower bit line and two upper bit lines.

19 Claims, 16 Drawing Sheets

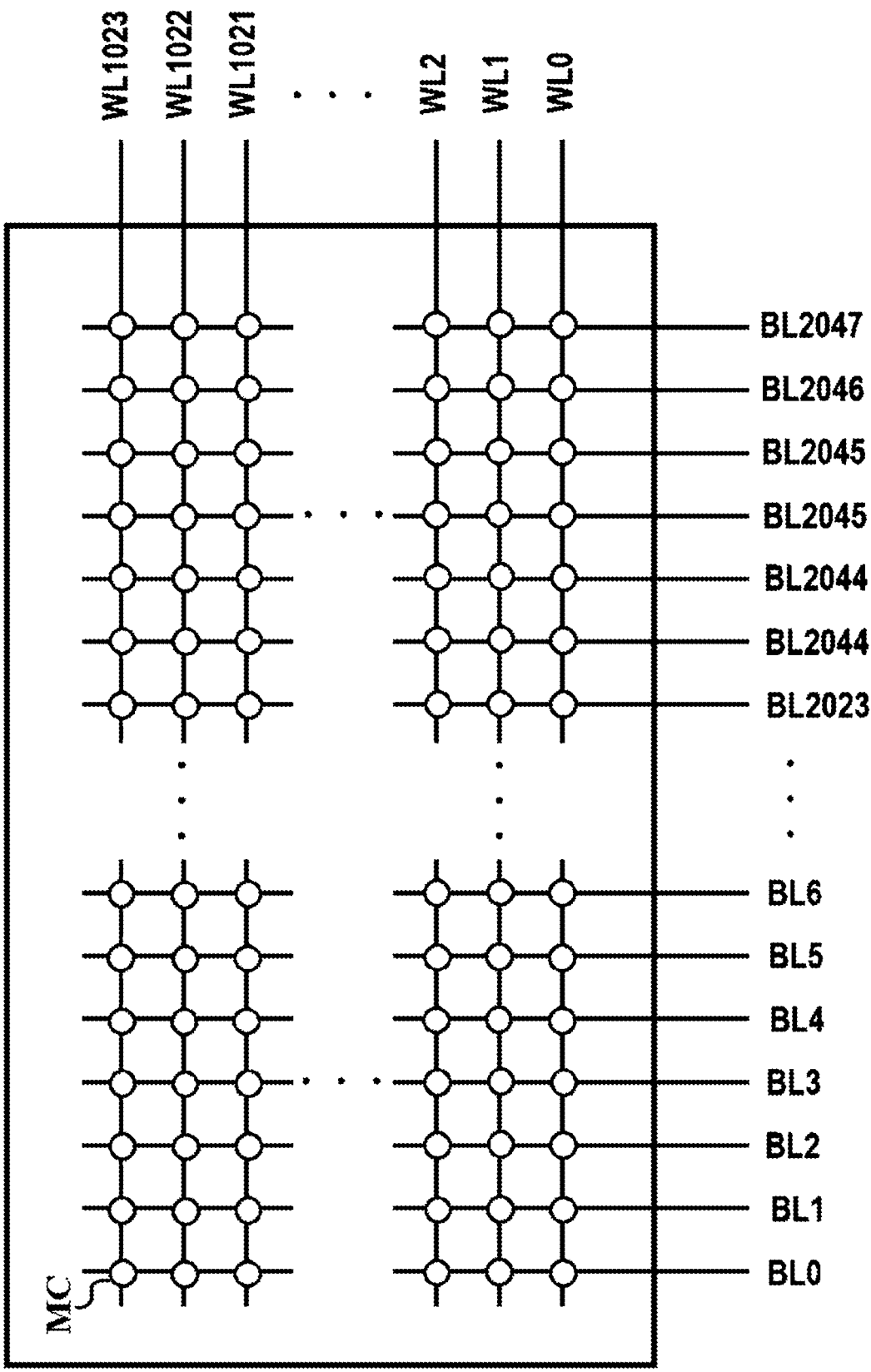

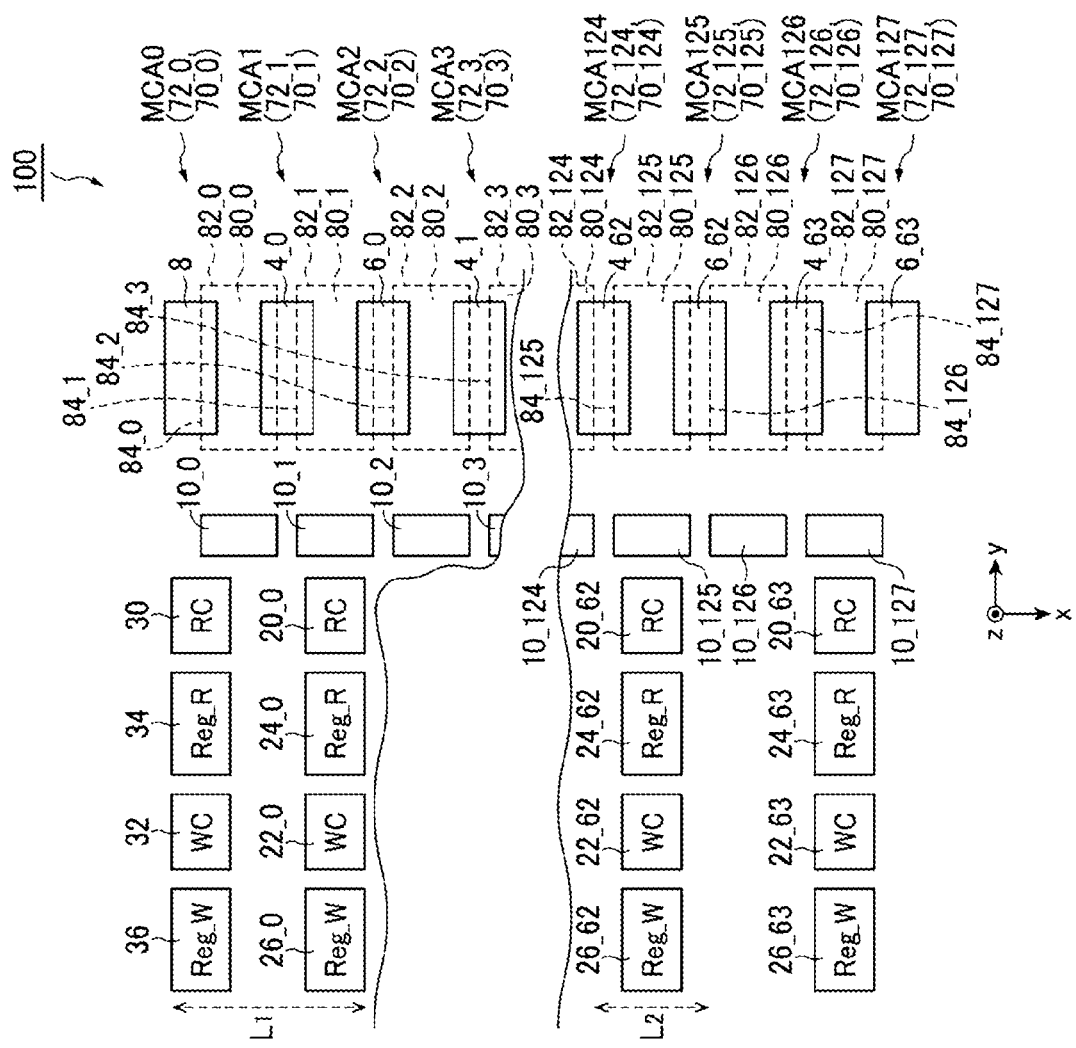
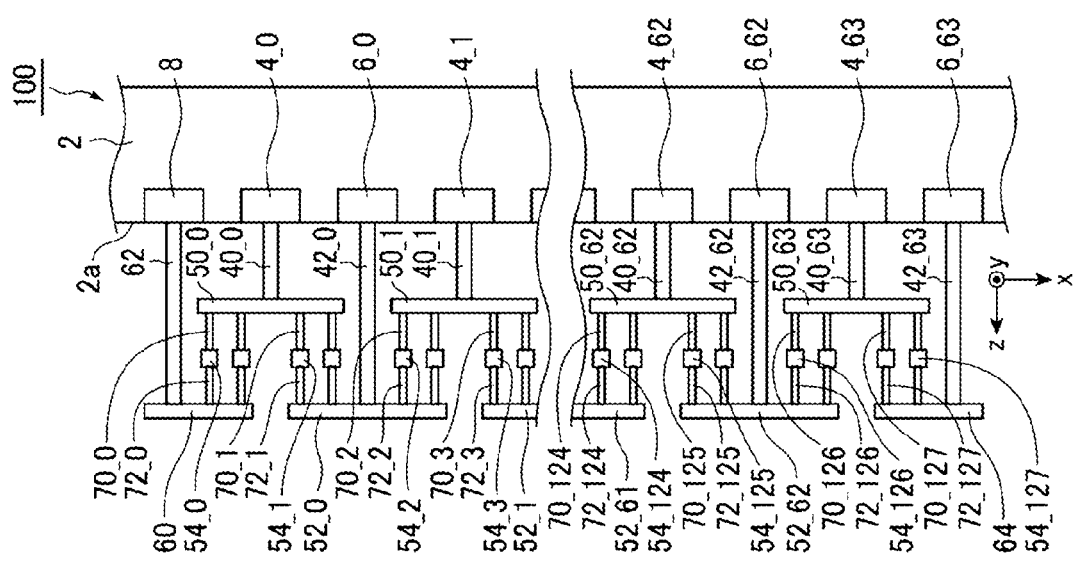

SEMICONDUCTOR STORAGE DEVICE

CROSS-REFERENCE TO RELATED APPLICATION

This application is based upon and claims the benefit of priority from Japanese Patent Application No. 2020-134197, filed on Aug. 6, 2020, the entire contents of which are incorporated herein by reference.

FIELD

Embodiments described herein relate generally to semiconductor storage devices.

BACKGROUND

A cross-point type memory device using a variable resistance element in a memory cell has been gaining acceptance as a large-capacity storage device.

In the cross-point type memory device, a large number of wirings called bit lines and word lines are crosswise-arranged, and memory cells are formed at intersection points of the bit lines and word lines. Writing in one memory cell is performed by applying a voltage or current to the bit line and word line connected to the cell.

DESCRIPTION OF THE DRAWINGS

FIG. 4 is a schematic diagram illustrating a connection relationship between the memory cell array, bit lines, and word lines of the embodiment;

FIGS. 6A and 6B are schematic views illustrating main portions of the semiconductor storage device;

DETAILED DESCRIPTION

Figure 1:
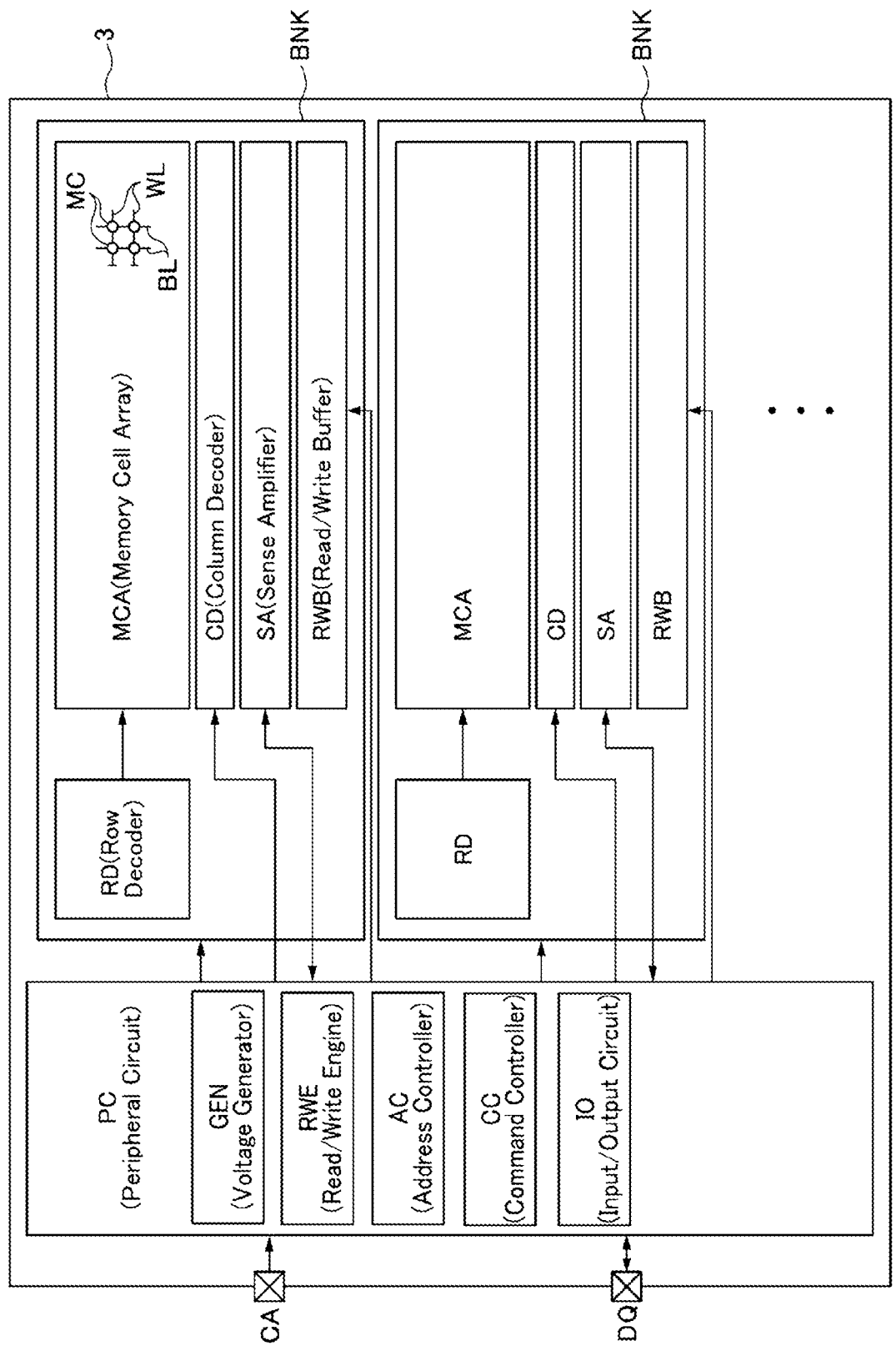
FIG. 1 is a block diagram illustrating a configuration of a semiconductor storage device according to an embodiment.

Embodiments provide a large-capacity semiconductor storage device.

According to an embodiment, a semiconductor storage device includes a plurality of lower bit lines extending in a first direction, the lower bit lines including first and second outer lower bit lines and a plurality of inner lower bit lines between the first and second outer lower bit lines; a plurality of word lines extending in a second direction crossing the first direction, and spaced from the plurality of lower bit lines in a third direction crossing the first and second directions, the word lines including first, second, and third word lines that are adjacent, and fourth and fifth word lines that are adjacent; a plurality of upper bit lines extending in the first direction, and spaced from the plurality of word lines in the third direction, the upper bit lines including first and second outer upper bit lines and a plurality of inner upper bit lines between the first and second outer upper bit lines, the inner upper bit lines including a first inner upper bit line adjacent to the first outer upper bit line and a second inner upper bit line adjacent to the second outer upper bit line; a memory cell array including a plurality of memory cells electrically connected between the lower bit lines and the word lines and between the upper bit lines and the word lines, the plurality of memory cells including a plurality of logical slices of memory cells. A memory cell from each of the logical slices is selected when carrying out a read operation or a write operation on the memory cell array, and the logical slices of memory cells include first and second logical slices. The first logical slice includes a first memory cell electrically connected between the first outer lower bit line and the first word line, a second memory cell electrically connected between the first outer lower bit line and the second word line, a third memory cell electrically connected between the first inner upper bit line and the second word line, and a fourth memory cell electrically connected between the first inner upper bit line and the third word line. The second logical slice includes a fifth memory cell electrically connected between the second outer lower bit line and the fourth word line, a sixth memory cell electrically connected between the second outer lower bit line and the fifth word line, a seventh memory cell electrically connected between the second outer upper bit line and the fifth word line, and an eighth memory cell electrically connected between the first outer upper bit line and the first word line.

Hereinafter, embodiments will be described with reference to the drawings. In the drawings, the same or similar components are denoted by the same or similar reference numerals.

In the specification, in order to indicate a positional relationship of parts and the like, the upward direction or the z direction described below with respect to the drawings is described as "upper", and the downward direction or the direction opposite to the z direction is described as "lower". In the specification, the concepts of "upper" and "lower" do not necessarily indicate a relationship with the direction of gravity.

Embodiment

FIG. 1 is a block diagram illustrating a configuration of a semiconductor storage device 3 of an embodiment.

The semiconductor storage device according to the embodiment is, for example, a volatile memory such as a phase-change memory (PCM) or a dynamic random access memory (DRAM) or a non-volatile memory such as a PCM, a NAND type electrically erasable and programmable read-only memory (EEPROM), a resistive random access memory (ReRAM), or a magnetoresistive random access memory (MRAM).

A semiconductor storage device 3 illustrated in FIG. 1 includes memory cell arrays MCA, column decoders CD, row decoders RD, sense amplifiers SA, read/write buffers RWB, and a peripheral circuit PC.

The memory cell array MCA includes, for example, a plurality of memory cells MCs two-dimensionally arranged in a matrix configuration. The memory cell MC is, for example, a resistance change type memory such as a PCM. The memory cells MC are arranged, for example, at intersection points of bit lines BL and word lines WL. That is, the memory cell array MCA is a so-called cross-point type memory cell array. When viewed from above a semiconductor substrate, the bit line BL is substantially perpendicular to (intersects) the word line WL. Each of the plurality of bit lines BL is connected to one end of the corresponding memory cell MC in the memory cell array MCA. Each of the plurality of word lines WL is connected to the other end of the corresponding memory cell MC in the memory cell array MCA. The memory cell array MCA is divided into a plurality of banks BNK in one chip, and the sense amplifier SA, the read/write buffer RWB, the row decoder RD, and the column decoder CD are provided for each bank BNK.

For example, the sense amplifier SA is connected to the memory cell MC via the bit line BL and applies a write voltage or a read voltage to the memory cell MC via the bit line BL. The sense amplifier SA writes data in the memory cell MC by applying the write voltage to the memory cell MC or reads data from the memory cell MC by applying the read voltage to the memory cell MC.

The read/write buffer RWB temporarily latches the data detected by the sense amplifier SA for each page or temporarily latches the data or address to be written to the memory cell array MCA for each page.

The row decoder RD and the column decoder CD access the memory cell array MCA based on a bank address and a page address and apply the write voltage and the read voltage to the word line WL and the bit line BL. The row decoder RD applies the write voltage or the read voltage to a selected word line selected from among the plurality of word lines WL. The column decoder CD connects a selected bit line selected from among the plurality of bit lines BL to the sense amplifier SA. The sense amplifier SA applies the write voltage or the read voltage to the selected bit line. Accordingly, the semiconductor storage device 3 can write data in a desired memory cell MC in the memory cell array MCA or read data from the desired memory cell MC.

Figure 2:
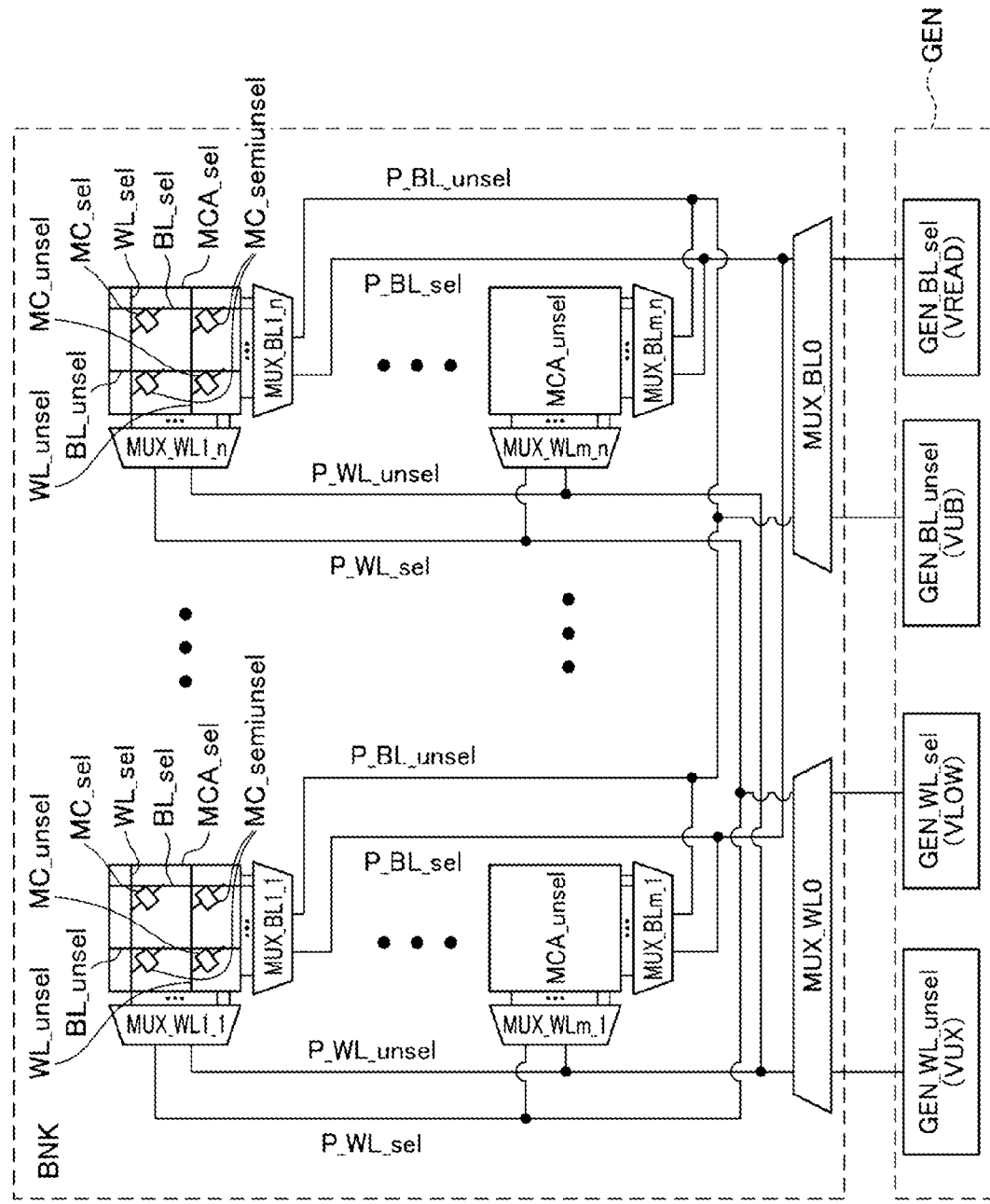
FIG. 2 is a block diagram illustrating the configuration of the semiconductor storage device.

The peripheral circuit PC includes, for example, a voltage generation circuit GEN, a read/write engine RWE, an address controller AC, a command controller CC, an input/output circuit IO, and the like. The voltage generation circuit GEN generates a voltage of the word line WL and a voltage of the bit line BL required for data read operation and data write operation. A more detailed configuration of the voltage generation circuit GEN is illustrated in FIG. 2. The read/write engine RWE controls the column decoder CD and row decoder RD to write data in the desired memory cell MC in the bank BNK according to commands and addresses or reads data from the desired memory cell MC in the bank BNK. The read/write engine RWE transmits the read data to a DQ buffer of an input/output circuit. The address controller AC receives a row address, a column address, and the like and decodes the addresses. The command controller CC receives commands indicating various operations such as a data read operation and a data write operation and transmits the commands to the read/write engine RWE. The input/output circuit IO acquires the command and the address from a CA terminal CA, transmits the command to the command controller CC, and transmits the address to the address controller AC. The command includes a write command instructing a write operation and a read command instructing a read operation. The address includes a bank address indicating one of the banks BNK of the memory cell array MCA and an address indicating a page or memory cell MC in the bank BNK of a read or write target. The input/output circuit IO acquires the write data from a DQ terminal and transmits the write data to the read/write buffer RWB. The input/output circuit also receives the read data latched in the data latch DL and outputs the read data through the DQ terminal.

A memory controller (not illustrated) may be provided outside the semiconductor storage device 3. A memory system may be configured with a plurality of semiconductor storage devices 3 and a memory controller (not illustrated) that controls the entire memory system.

FIG. 2 is a block diagram illustrating a more detailed configuration example of the bank BNK, the column decoder CD, and the row decoder RD in the semiconductor storage device 3. The column decoder CD includes multiplexers MUX_BL1_1 to MUX_BLm_n and MUX_BL0. The row decoder RD includes multiplexers MUX_WL1_1 to MUX_WLm_n and MUX_WL0. The bank BNK may include a plurality of the memory cell arrays MCA subdivided corresponding to the multiplexers MUX_BL1_1 to MUX_BLm_n and MUX_WL1_1 to MUX_WLm_n.

As illustrated in FIG. 2, the voltage generation circuit GEN includes a selected BL voltage generation circuit GEN_BL_sel, a non-selected BL voltage generation circuit GEN_BL_unsel, a selected WL voltage generation circuit GEN_WL_sel, and a non-selected WL voltage generation circuit GEN_WL_unsel.

The multiplexer is implemented by a switching element such as a metal oxide semiconductor field effect transistor (MOSFET).

The column decoder CD includes multiplexers MUX_BL1_1 to MUX_BLm_n and MUX_BL0. Each of the multiplexers MUX_BL1_1 to MUX_BLm_n is provided for a respective one of the memory cell arrays MCA and is connected to the plurality of bit lines BL of the respective memory cell array MCA. It is noted that each of m and n is an integer of 1 or more.

The selected BL voltage generation circuit GEN_BL_sel and the non-selected BL voltage generation circuit GEN_BL_unsel are connected to the multiplexer MUX_BL0 of the column decoder CD. The multiplexer MUX_BL0 is connected to the multiplexers MUX_BL1_1 to MUX_BLm_n via bit line paths P_BL_sel and P_BL_unsel.

The multiplexers MUX_BL1_1 to MUX_BLm_n connect one selected bit line BL_sel selected from among the bit lines BL of the corresponding memory cell array MCA to the selected bit line path P_BL_sel and apply a selected bit line voltage V_bl_sel. The multiplexers MUX_BL1_1 to MUX_BLm_n connect non-selected bit lines BL_unsel other than the selected bit line BL_sel to the non-selected bit line path P_BL_unsel and apply a non-selected bit line voltage V_bl_unsel.

The multiplexer MUX_BL0 is connected between the selected BL voltage generation circuit GEN_BL_sel and the plurality of bit line paths and between the non-selected BL voltage generation circuit GEN_BL_unsel and the plurality of bit line paths. The multiplexer MUX_BL0 connects one selected bit line path from the plurality of bit line paths to the selected BL voltage generation circuit GEN_BL_sel as the selected bit line path P_BL_sel. In addition, the multiplexer MUX_BL0 connects the non-selected bit line path among the plurality of bit line paths as P_BL_unsel to the non-selected BL voltage generation circuit GEN_BL_unsel.

The bit line paths P_BL_sel and P_BL_unsel are wiring paths connected between the multiplexers MUX_BL1_1 to MUX_BLm_n and the multiplexer MUX_BL0. For example, 16, 32, 64, or 1024 bit line paths are provided. As described above, the multiplexer MUX_BL0 selects one of the plurality of bit line paths and connects the selected bit line path P_BL_sel to the selected BL voltage generation circuit GEN_BL_sel. The selected bit line path P_BL_sel transfers the selected bit line voltage V_bl_sel. On the other hand, the multiplexer MUX_BL0 connects the non-selected bit line path P_BL_unsel among the plurality of bit line paths to the non-selected BL voltage generation circuit GEN_BL_unsel. The bit line path P_BL_unsel transfers the non-selected bit line voltage V_bl_unsel.

The selected BL voltage generation circuit GEN_BL_sel generates the selected bit line voltage V_bl_sel applied to the selected bit line BL_sel from an external power source.

The selected bit line voltage V_bl_sel is a high level voltage, for example, several volts. The selected bit line path P_BL_sel transfers the selected bit line voltage V_bl_sel from the multiplexer MUX_BL0 to the multiplexers MUX_BL1_1 to MUX_BLm_n. The multiplexers MUX_BL1_1 to MUX_BLm_n and MUX_BL0 electrically connect the selected bit line BL_sel among the plurality of bit lines BL to the selected BL voltage generation circuit GEN_BL_sel via the selected bit line path P_BL_sel and selectively apply the selected bit line voltage V_bl_sel to the selected bit line BL_sel.

The non-selected BL voltage generation circuit GEN_BL_unsel generates the non-selected bit line voltage V_bl_unsel applied to the non-selected bit line BL_unsel from an external power source. The non-selected bit line voltage V_bl_unsel is a voltage between the selected bit line voltage V_bl_sel and a selected word line voltage V_wl_sel, and for example, V_bl_sel/2. The non-selected bit line path P_BL_unsel transfers the non-selected bit line voltage V_bl_unsel from the multiplexer MUX_BL0 to the multiplexers MUX_BL1_1 to MUX_BLm_n. The multiplexers MUX_BL0 and MUX_BL1_1 to MUX_BLm_n electrically connect the non-selected bit line BL_unsel to the non-selected BL voltage generation circuit GEN_BL_unsel via the non-selected bit line path P_BL_unsel and selectively apply the non-selected bit line voltage V_bl_unsel to the non-selected bit line BL_unsel.

The row decoder RD includes multiplexers MUX_WL1_1 to MUX_WLm_n and MUX_WL0. Each of the multiplexers MUX_WL1_1 to MUX_WLm_n is provided for a respective one of the memory cell arrays MCA and is connected to the plurality of word lines WL of the respective memory cell array MCA.

The selected WL voltage generation circuit GEN_WL_sel and the non-selected WL voltage generation circuit GEN_WL_unsel are connected to the multiplexer MUX_WL0 of the row decoder RD. The multiplexer MUX_WL0 is connected to the multiplexers MUX_WL1_1 to MUX_WLm_n via word line paths P_WL_sel and P_WL_unsel.

The multiplexers MUX_WL1_1 to MUX_WLm_n connect one selected word line WL_sel selected from among the word line WL of the corresponding memory cell array MCA to the word line path P_WL_sel and apply the selected word line voltage V_wl_sel. The multiplexers MUX_WL1_1 to MUX_WLm_n connect a non-selected word line WL_unsel other than the selected word line WL_sel to the word line path P_WL_unsel, and apply a non-selected word line voltage V_wl_unsel. The multiplexer MUX_WL0 is connected between the selected WL voltage generation circuit GEN_WL_sel and the plurality of word line paths and between the non-selected WL voltage generation circuit GEN_WL_unsel and the plurality of word line paths. The multiplexer MUX_WL0 connects one selected word line path selected from among the plurality of word line paths as P_WL_sel to the selected WL voltage generation circuit GEN_WL_sel. In addition, the multiplexer MUX_WL0 connects the non-selected word line path among the plurality of word line paths as P_WL_unsel to the non-selected WL voltage generation circuit GEN_WL_unsel.

The word line paths P_WL_sel and P_WL_unsel are wiring paths connected between the multiplexers MUX_WL1_1 to MUX_WLm_n and the multiplexer MUX_WL0. For example, 16, 32, 64, or 1024 word line paths are provided. As described above, the multiplexer MUX_WL0 selects one of the plurality of word line paths and connects the selected word line path P_WL_sel to the selected WL voltage generation circuit GEN_WL_sel. The word line path P_WL_sel transfers the selected word line voltage V_wl_sel. On the other hand, the multiplexer MUX_WL0 connects the non-selected word line path P_WL_unsel among the plurality of word line paths to the non-selected WL voltage generation circuit GEN_WL_unsel. The word line path P_WL_unsel transfers the non-selected word line voltage V_wl_unsel. The selected WL voltage generation circuit GEN_WL_sel generates the selected word line voltage V_wl_sel applied to the selected word line WL_sel from an external power source. The selected word line voltage V_wl_sel is a low level voltage, for example, a ground voltage (0 V). The word line path P_WL_sel transfers the selected word line voltage V_wl_sel from the multiplexer MUX_WL0 to the multiplexers MUX_WL1_1 to MUX_WLm_n. The multiplexers MUX_WL1_1 to MUX_WLm_n and MUX_WL0 electrically connect the selected word line WL_sel among the plurality of word lines WL to the selected WL voltage generation circuit GEN_WL_sel via the selected word line path P_WL_sel and selectively connect the selected word line voltage V_wl_sel to the selected word line WL_sel.

The non-selected WL voltage generation circuit GEN_WL_unsel generates the non-selected word line voltage V_wl_unsel applied to the non-selected word line WL_unsel from an external power source. The non-selected word line voltage V_wl_unsel is a voltage between the selected bit line voltage V_bl_sel and the selected word line voltage V_wl_sel and is, for example V_bl_sel/2. It is preferable that the non-selected word line voltage V_wl_unsel is substantially equal to the non-selected bit line voltage V_bl_unsel. However, the non-selected word line voltage V_wl_unsel may be different from the non-selected bit line voltage V_bl_unsel. The non-selected word line path P_WL_unsel transfers the non-selected word line voltage V_wl_unsel from the multiplexer MUX_WL0 to the multiplexers MUX_WL1_1 to MUX_WLm_n. The multiplexers MUX_WL1_1 to MUX_WLm_n electrically connect the non-selected word line WL_unsel to the non-selected WL voltage generation circuit GEN_WL_unsel via the non-selected word line path P_WL_unsel and selectively apply the non-selected word line voltage V_wl_unsel to the non-selected word line WL_unsel.

Accordingly, a voltage difference between the selected bit line voltage V_bl_sel and the selected word line voltage V_wl_sel is applied to the selected memory cell MC_sel connected to the selected bit line BL_sel and the selected word line WL_sel. Accordingly, the data is read from the selected memory cell MC_sel, or the data is written to the selected memory cell MC_sel.

The configurations of the bank BNK, the column decoder CD, and the row decoder RD are not limited to the one described above. For example, the mode of connection between each multiplexer and each memory cell array MCA is not limited to the one described above. For example, herein, an example is illustrated in which the bit line BL is one layer (BL0), the word line WL is one layer (WL0), and the memory cell is one layer. However, the number of layers of the bit lines BL, the number of layers of the word lines WL, and the number of layers of the memory cells are not limited as illustrated. For example, a layer of bit line BL may be provided so that the total number of wirings is set to be three layers (for example, BL0, WL0, and BL1), and the memory cell may be configured to have a two-layer structure. In addition, the column decoder CD and the row decoder RD are configured to be able to drive the plurality of bit lines BL and the plurality of word lines WL, respectively. The number of layers of the bit line BL and the word line WL may be set to be a total of 5 layers (for example, BL0, WL0, BL1, WL1, and BL2), and the memory cell may be configured to have a 4-layer structure. Further, the column decoder CD and the row decoder RD are configured to be able to drive the plurality of bit lines BL and the plurality of word lines WL, respectively, but any one (for example, bit line BL) of the bit lines BL and the word lines WL may be independently driven in units of even-numbered layers (for example, BL0 and BL2) and odd-numbered layers (for example, BL1).

Figure 3B:
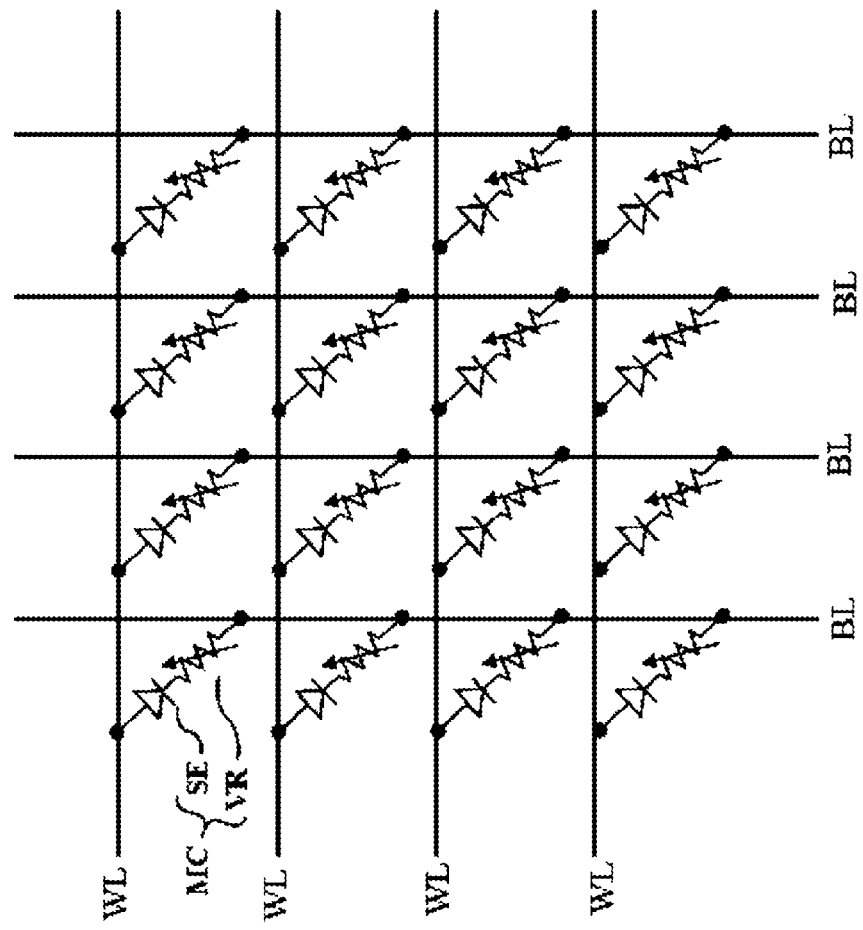
FIGS. 3A and 3B are schematic diagrams of a memory cell array of the embodiment.
Figure 3A:
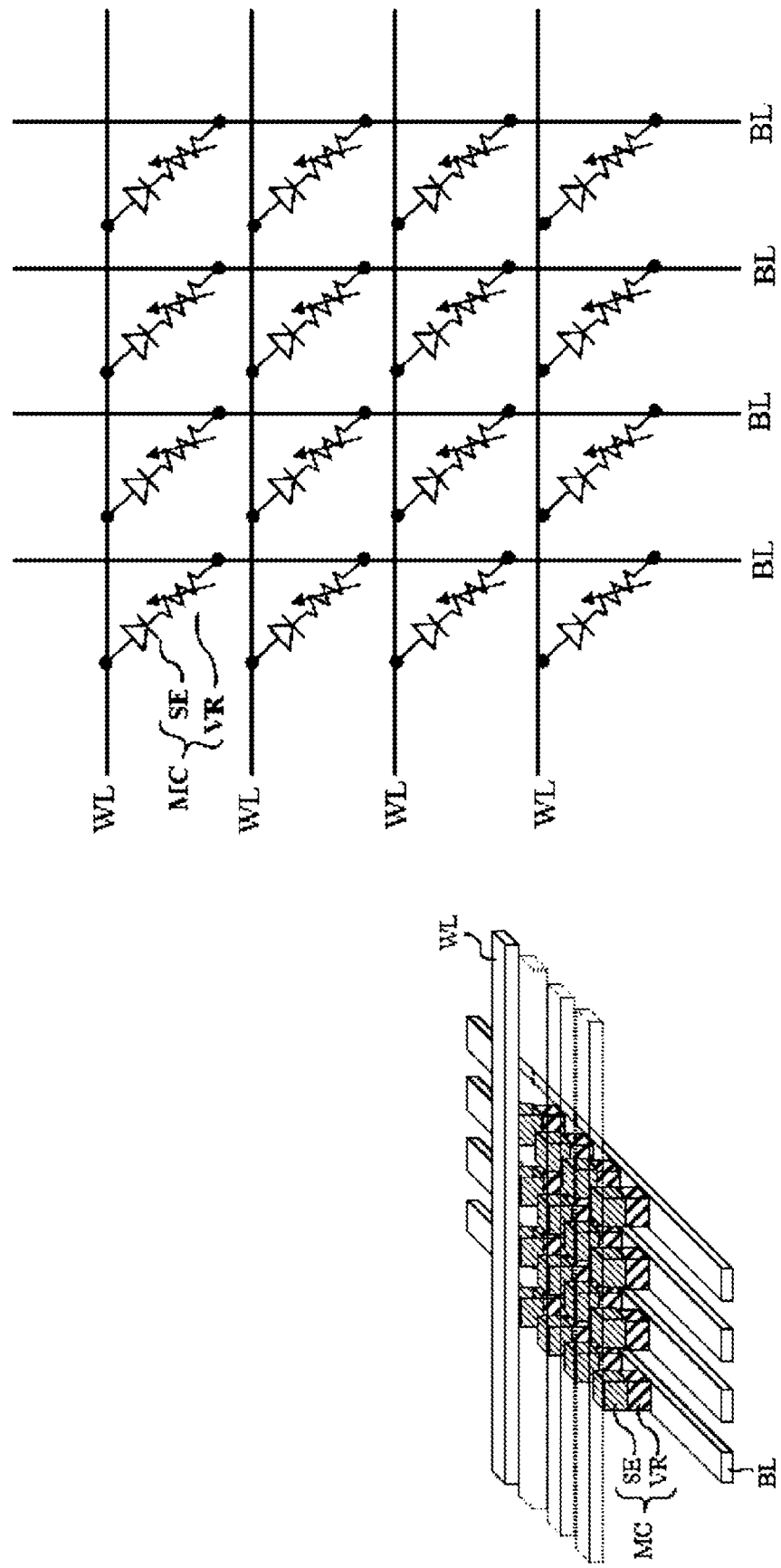

FIGS. 3A and 3B are schematic diagrams of the memory cell array MCA of the embodiment.

FIG. 3A is a perspective view schematically illustrating the memory cells MC, the bit lines BL, and the word lines WL in the memory cell array MCA.

As illustrated in FIG. 3A, for example, the plurality of bit lines BL extend at intervals in the same direction, and above the plurality of bit lines, the plurality of word lines WL extend at intervals, for example, in a direction perpendicular to the direction in which the BL lines extend. Then, the plurality of memory cells MC are arranged at the intersection points of the plurality of bit lines BL and the plurality of word lines WL. Accordingly, a cross-point type memory cell array MCA is configured in which the plurality of memory cells MC are arranged in a matrix configuration in a plan view.

An example in which each of the bit line BL and the word line WL have one layer and one layer of memory cell MC is arranged between the layers is illustrated in FIG. 3A, but embodiments are not limited thereto. The number of layers in which the memory cells MC is arranged may be further increased, and the number of layers of the bit lines BL and/or the word lines WL may be further increased correspondingly. For example, the plurality of bit lines BL extending in a direction perpendicular to the direction in which the word lines WL extend may be further provided at intervals on the plurality of word lines WL in FIG. 3A, and the plurality of memory cells MC may be further arranged at the intersection points of the plurality of word lines WL and the plurality of upper bit lines BL. Here, the memory cell MC has two layers, and the wiring layers (the layer of the bit line BL and the layer of the word line WL) are three layers.

FIG. 3B is a diagram schematically illustrating a circuit configuration of the memory cell array MCA in the semiconductor storage device 3. Each memory cell MC is connected between the corresponding word line WL and the corresponding bit line BL. The memory cell MC includes, for example, a variable resistance element VR and a switching element SE.

The variable resistance element VR can enter a low resistance state and a high resistance state. The variable resistance element VR latches 1-bit data, that is, the first value and the second value, by using the difference between the resistance states of the low resistance state and the high resistance state. The low resistance state may be set to be a first value (e.g., 0) and the high resistance state may be set to be a second value (e.g., 1), or the low resistance state may be set to be the second value and the high resistance state may be set to be the first value.

The switching element SE enters, for example, a high resistance state (non-conducting state, OFF state) when the applied voltage is less than the threshold voltage, and enters a low resistance state (conducting state, ON state) when the applied voltage is equal to or more than the threshold voltage. Accordingly, the switching element SE functions as a rectifying element having a rectifying function. The switching element SE may be a bidirectional rectifying element. The configuration of the memory cell array MCA is not limited thereto.

FIG. 4 is a schematic diagram illustrating a connection relationship between the bit lines BL and the word lines WL with respect to the memory cell array MCA in the semiconductor storage device 3 according to the embodiment. For example, 2048 bit lines BL and 1024 word lines WL are connected to the memory cell array MCA. The total number of bit lines BL and the total number of word lines WL are not limited thereto. For example, each of the total number of bit lines BL and the total number of word lines WL may be, for example, 32 lines, 64 lines, and 1024 lines. The plurality of memory cell arrays MCA may be provided in one semiconductor storage device 3.

Figure 5:
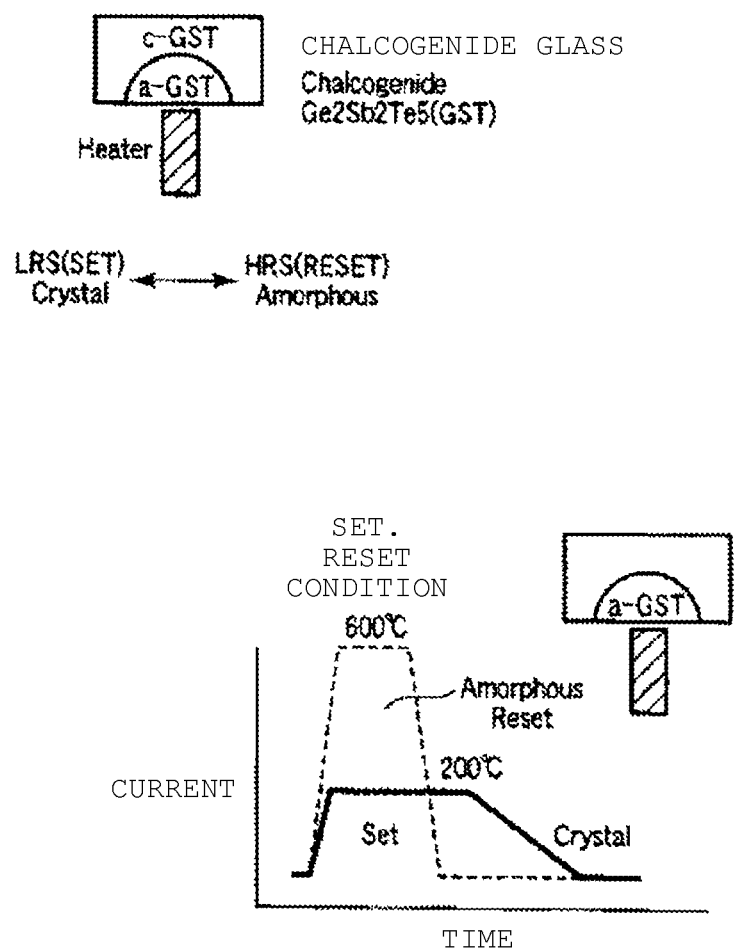
FIG. 5 is a schematic diagram schematically illustrating a function of a variable resistance element of the embodiment.

FIG. 5 schematically illustrates the function of the variable resistance element VR in the embodiment. In the embodiment, the variable resistance element VR contains, for example, chalcogenide glass (GST: $Ge_2Sb_2Te_5$). When a current is allowed to flow between the bit line BL and the word line WL, the electrode provided adjacent to the variable resistance element VR functions as a heater to generate heat. Due to the heat, the chalcogenide glass is melted, and thus, the state transitions. For example, when the chalcogenide glass melts at a high temperature (due to high current) and cools at a high speed (stops the current), the chalcogenide glass goes into an amorphous state (the operation referred to as a reset operation), and when the chalcogenide glass melts at a relatively low temperature (due to low current) and cools at a slow speed (reduces the current gradually), the chalcogenide glass crystallizes (the operation referred to as a set operation). Accordingly, during the reading, 1-bit information is determined with the case where the current flowing between the bit line BL and the word line WL is large (low resistance state=crystalline state) and the case where the current is small (high resistance state=amorphous state). Although the cell configuration using the chalcogenide glass is illustrated herein, the material used in the embodiment is not limited to the chalcogenide glass.

FIGS. 6A and 6B are diagrams schematically illustrating main portions of the semiconductor storage device 100 according to the embodiment. FIG. 6A is an example of a schematic cross-sectional view of the semiconductor storage device 100 according to the embodiment in a plane perpendicular to a substrate 2.

Herein, an x direction, a y direction perpendicularly intersecting the x direction, and a z direction perpendicularly intersecting the x direction and the y direction are defined. FIG. 6A is an example of a schematic cross-sectional view of the semiconductor storage device 100 according to the embodiment in the xz plane.

The semiconductor storage device 100 has the substrate 2. The substrate 2 is, for example, a semiconductor substrate such as an Si substrate, but the substrate 2 is not limited thereto. It is assumed that the substrate 2 is arranged parallel to the xy plane. The substrate 2 has a substrate surface 2a extending in the x direction and the y direction.

A region 80_0, a region 80_1, a region 80_2, a region 80_3, . . . , a region 80_124, a region 80_125, a region 80_126, and a region 80_127 (see FIG. 6B) are provided in this order on the substrate surface 2a as the region 80 along the x direction. Each of the regions 80 has a rectangular shape and has a side 82 parallel to the x direction and a side 84 intersecting the side 82 and being parallel to the y direction.

The memory cell array MCA is provided above each region 80. For example, a memory cell array MCA0 is provided above a region 80_0. Similarly, a memory cell array MCA1 is provided above the region 80_1. A memory cell array MCA2 is provided above the region 80_2. A memory cell array MCA3 is provided above the region 80_3. A memory cell array MCA124 is provided above the region 80_124. A memory cell array MCA125 is provided above the region 80_125. A memory cell array MCA126 is provided above the region 80_126. A memory cell array MCA127 is provided above the region 80_127.

Next, a specific configuration of the memory cell array MCA in the semiconductor storage device according to the embodiment will be described below.

The semiconductor storage device 100 includes a BL0 50 as a bit line BL0. More specifically, the semiconductor storage device 100 includes a BL0 50_0, a BL0 50_1, . . . , a BL0 50_62, and a BL0 50_63. Each BL0 50 is provided over the two regions 80, in other words, over the two regions to be parallel to the substrate surface 2a so that the longitudinal direction is along the x direction. The BL0 50_0 is provided over the region 80_0 and the region 80_1. The BL0 50_1 is provided over the region 80_2 and the region 80_3. The BL0 50_62 is provided over the region 80_124 and the region 80_125. The BL0 50_63 is provided over the region 80_126 and the region 80_127. Each BL0 50 is intersected by a first virtual line parallel to the x direction. In FIG. 6A, for the convenience of illustration, for example, only one BL0 50_0 is illustrated. However, in fact, the plurality of BL0 50_0 are provided side by side in the y direction. The same applies to other BL0.

The semiconductor storage device 100 includes a WL0 54 as a word line WL0. More specifically, the semiconductor storage device 100 includes a WL0 54_0, a WL0 54_1, a WL0 54_2, a WL0 54_3, . . . , a WL0 54_124, a WL0 54_125, a WL0 54_126, and a WL0 54_127. Each WL0 54 is provided on the BL0 50 above each region 80 to be parallel to the substrate surface 2a so that the longitudinal direction is along the y direction. The WL0 54_0 is provided on the BL0 50_0 above the region 80_0 to be parallel to the substrate surface 2a so that the longitudinal direction is along the y direction. The WL0 54_1 is provided on the BL0 50_0 above the region 80_1 to be parallel to the substrate surface 2a so that the longitudinal direction is along the y direction. The WL0 54_2 is provided on the BL0 50_1 above the region 80_2 to be parallel to the substrate surface 2a so that the longitudinal direction is along the y direction. The WL0 54_3 is provided on the BL0 50_1 above the region 80_3 to be parallel to the substrate surface 2a so that the longitudinal direction is along the y direction. The WL0 54_124 is provided on the BL0 50_62 above the region 80_124 to be parallel to the substrate surface 2a so that the longitudinal direction is along the y direction. The WL0 54_125 is provided on the BL0 50_62 above the region 80_125 to be parallel to the substrate surface 2a so that the longitudinal direction is along the y direction. The WL0 54_126 is provided on the BL0 50_63 above the region 80_126 to be parallel to the substrate surface 2a so that the longitudinal direction is along the y direction. The WL0 54_127 is provided on the BL0 50_63 above the region 80_127 to be parallel to the substrate surface 2a so that the longitudinal direction is along the y direction.

The semiconductor storage device 100 includes a BL1 60, a BL1 52, and a BL1 64 as a bit line BL1. More specifically, the semiconductor storage device 100 includes the BL1 60, a BL1 52_0, a BL1 52_1, . . . , a BL1 52_61, a BL1 52_62, and the BL1 64. Each BL1 52 is provided on the WL0 provided above the two regions 80, in other words, over the WL0 provided on the two regions to be parallel to the substrate surface 2a so that the longitudinal direction is along the x direction. Herein, the BL1 52 is provided over two regions 80 which are alternated with the BL0 50. The BL1 60 is provided on the WL0 54_0 above the region 80_0 to be parallel to the substrate surface 2a so that the longitudinal direction is along the x direction. The BL1 52_0 is provided on the WL0 54_1 above the region 80_1 and on the WL0 54_2 above the region 80_2 to be parallel to the substrate surface 2a so that the longitudinal direction is along the x direction. The BL1 52_1 is provided on the WL0 54_3 above the region 80_3 and on the WL0 54_4 (not illustrated) above the region 80_4 (not illustrated) to be parallel to the substrate surface 2a so that the longitudinal direction is along the x direction. The BL1 52_61 is provided on the WL0 54_123 (not illustrated) above the region 80_123 (not illustrated) and on the WL0 54_124 above the region 80_124 to be parallel to the substrate surface 2a so that the longitudinal direction is along the x direction. The BL1 52_62 is provided on the WL0 54_125 above the region 80_125 and on the WL0 54_126 above the region 80_126 to be parallel to the substrate surface 2a so that the longitudinal direction is along the x direction. The BL1 64 is provided on the WL0 54_127 above the region 80_127 to be parallel to the substrate surface 2a so that the longitudinal direction is along the x direction. Each of the BL1 60, the BL1 52, and the BL1 64 is intersected by a second virtual line parallel to the x direction. In FIG. 6A, for convenience of illustration, for example, only one BL1 60 is illustrated. However, in fact, the plurality of BL1s 60 are provided side by side in the y direction. The same applies to other BL1.

The memory cell array MCA0 includes a lower layer memory cell 70_0 and an upper layer memory cell 72_0. Each memory cell 70_0 is provided between the BL0 50_0 and the WL0 54_0. Each memory cell 72_0 is provided between the WL0 54_0 and the BL1 60 and overlaps the memory cell 70_0 when viewed from above.

The memory cell array MCA1 includes a lower layer memory cell 70_1 and an upper layer memory cell 72_1. Each memory cell 70_1 is provided between the BL0 50_0 and the WL0 54_1. Each memory cell 72_1 is provided between the WL0 54_1 and the BL1 52_0 and overlaps the memory cell 70_1 when viewed from above.

The memory cell array MCA2 includes a lower layer memory cell 70_2 and an upper layer memory cell 72_2. Each memory cell 70_2 is provided between the BL0 50_1 and the WL0 54_2. Each memory cell 72_2 is provided between the WL0 54_2 and the BL1 52_0 and overlaps the memory cell 70_2 when viewed from above.

The memory cell array MCA3 includes a lower layer memory cell 70_3 and an upper layer memory cell 72_3. Each memory cell 70_3 is provided between the BL0 50_1 and the WL0 54_3. Each memory cell 72_3 is provided between the WL0 54_3 and the BL1 52_1 and overlaps the memory cell 70_3 when viewed from above.

The memory cell array MCA124 includes a lower layer memory cell 70_124 and an upper layer memory cell 72_124. Each memory cell 70_124 is provided between the BL0 50_62 and the WL0 54_124. Each memory cell 72_124 is provided between the WL0 54_124 and the BL1 52_61 and overlaps memory cell 70_124 when viewed from above.

The memory cell array MCA125 includes a lower layer memory cell 70_125 and an upper layer memory cell 72_125. Each memory cell 70_125 is provided between the BL0 50_62 and the WL0 54_125. Each memory cell 72_125 is provided between the WL0 54_125 and the BL1 52_62 and overlaps the memory cell 70_125 when viewed from above.

The memory cell array MCA126 includes a lower layer memory cell 70_126 and an upper layer memory cell 72_126. Each memory cell 70_126 is provided between the BL0 50_63 and the WL0 54_126. Each memory cell 72_126 is provided between the WL0 54_126 and the BL1 52_62 and overlaps the memory cell 70_126 when viewed from above.

The memory cell array MCA127 includes a lower layer memory cell 70_127 and an upper layer memory cell 72_127. Each memory cell 70_127 is provided between the BL0 50_63 and the WL0 54_127. Each memory cell 72_127 is provided between the WL0 54_127 and the BL1 64 and overlaps the memory cells 70_127 when viewed from above.

As described above, in the semiconductor storage device 100 according to the embodiment, the memory cell arrays MCA provided above the respective regions 80 and adjacent to each other share the BL0 50 or the BL1 52 and are connected by the BL0 50 or the BL1 52. For example, the memory cell array MCA0 provided above the region 80_0 and the memory cell array MCA1 provided above the region 80_1 share the BL0 50_0 as the bit line BL0 and are connected to each other by the BL0 50_0. The memory cell array MCA1 provided above the region 80_1 and the memory cell array MCA2 provided above the region 80_2 share the BL1 52_0 as the bit line BL1 and are connected to each other by the BL1 52_0.

A multiplexer 4_0 is provided on the substrate 2 below the BL0 50_0. Each of the plurality of connection wirings 40_0 connects the BL0 50_0 and the multiplexer 4_0. A multiplexer 6_0 is provided on the substrate 2 below the BL1 52_0. Each of the plurality of connection wirings 42_0 connects the BL1 52_0 and the multiplexer 6_0. A multiplexer 4_1 is provided on the substrate 2 below the BL0 50_1. Each of the plurality of connection wirings 40_1 connects the BL0 50_1 and the multiplexer 4_1. A multiplexer 4_62 is provided on the substrate 2 below the BL0 50_62. Each of the plurality of connection wirings 40_62 connects the BL0 50_62 and the multiplexer 4_62. A multiplexer 6_62 is provided on the substrate 2 below the BL1 52_62. Each of the plurality of connection wirings 42_62 connects the BL1 52_62 and the multiplexer 6_62. A multiplexer 4_63 is provided on the substrate 2 below the BL0 50_63. Each of the plurality of connection wirings 40_63 connects the BL0 50_63 and the multiplexer 4_63. A multiplexer 6_63 is provided on the substrate 2 below the BL1 64. Each of the plurality of connection wirings 42_63 connects the BL1 64 and the multiplexer 6_63.

FIG. 6B is an example of a schematic view of the semiconductor storage device 100 according to the embodiment when the substrate 2 is viewed from above.

A multiplexer 10_0 is provided on the substrate 2 and is connected to the WL0 54_0. A multiplexer 10_1 is provided on the substrate 2 and is connected to the WL0 54_1. A multiplexer 10_2 is provided on the substrate 2 and is connected to the WL0 54_2. A multiplexer 10_3 is provided on the substrate 2 and is connected to the WL0 54_3. A multiplexer 10_124 is provided on the substrate 2 and is connected to the WL0 54_124. A multiplexer 10_125 is provided on the substrate 2 and is connected to the WL0 54_125. A multiplexer 10_126 is provided on the substrate 2 and is connected to the WL0 54_126. A multiplexer 10_127 is provided on the substrate 2 and is connected to the WL0 54_127.

A writing circuit 22_0, . . . , a writing circuit 22_62, a writing circuit 22_63, and a writing circuit 32 are provided on the substrate 2. The writing circuit 22_0 is connected to the multiplexer 4_0 and the multiplexer 6_0. The writing circuit 22_62 is connected to the multiplexer 4_62 and the multiplexer 6_62. The writing circuit 22_63 is connected to the multiplexer 4_63 and the multiplexer 6_63. The writing circuit 32 is connected to the multiplexer 8.

A reading circuit 20_0, . . . , a reading circuit 20_62, a reading circuit 20_63, and a reading circuit 30 are provided on the substrate 2. The reading circuit 20_0 is connected to the multiplexer 4_0 and the multiplexer 6_0. The reading circuit 20_62 is connected to the multiplexer 4_62 and the multiplexer 6_62. The reading circuit 20_63 is connected to the multiplexer 4_63 and the multiplexer 6_63. The reading circuit 30 is connected to the multiplexer 8.

The writing circuits 22, the writing circuit 32, the reading circuits 20, and the reading circuit 30 correspond to, for example, the sense amplifier SA illustrated in FIG. 1.

A write register 26_0, . . . , a write register 26_62, a write register 26_63, and a write register 36 are provided on the substrate 2. The write register 26_0 is connected to the multiplexer 10_0, the multiplexer 10_1, and the multiplexer 10_2. The write register 26_62 is connected to a multiplexer 10_124, a multiplexer 10_125, and a multiplexer 10_126. The write register 26_63 is connected to the multiplexer 10_126 and a multiplexer 10_127. The write register 36 is connected to the multiplexer 10_0.

A read register 24_0, . . . , a read register 24_62, a read register 24_63, and a read register 34 are provided on the substrate 2. The read register 24_0 is connected to the first reading circuit 20_0. The read register 24_62 is connected to the reading circuit 20_62. The read register 24_63 is connected to the reading circuit 20_63. The read register 34 is connected to the reading circuit 30.

A length $L_1$ of the region including the reading circuit 20_0, the reading circuit 30, the writing circuit 22_0, the writing circuit 32, the read register 24_0, the read register 34, the write register 26_0, and the write register 36 in the x direction along the substrate surface 2a is larger than a length $L_2$ of the region including the reading circuit 24_62, the writing circuit 22_62, the read register 24_62, and the write register 26_62 in the x direction along the substrate surface 2a.

In the embodiments, the memory cell 70_0, the memory cell 70_1, the memory cell 72_1, and the memory cell 72_2 are treated as memory cells of the same slice. The memory cell 70_124, the memory cell 70_125, the memory cell 72_125, and the memory cell 72_126 are treated as memory cells of the same slice. That is, when k is set to be an odd number from 1 to 125 (1, 3, 5, . . . , 121, 123, and 125), the memory cell 70_(k−1), the memory cell 70_k, the memory cell 72_k, and the memory cell 72 (k+1) are treated as memory cells of the same slice. In each 65 slices, the memory cell 70_(k−1) and the memory cell 70_k directly share the bit line 50_[(k−1)/2] of the BL0 layer, and the memory cell 72_k and the memory cell 72 (k+1) directly share the bit line 52_[(k−1)/2] of the BL1 layer.

In the embodiment, the memory cell 70_126, the memory cell 70_127, the memory cell 72_127, and the memory cell 72_0 are treated as memory cells of the same slice. In this slice, the memory cell 70_126 and the memory cell 70_127 directly share the bit line 50_63 of the BL0 layer, whereas the memory cell 72_127 and the memory cell 72_0 do not directly share any bit line of the BL1 layer.

Accordingly, the memory cells 70_0 to the memory cells 72_127 form 64 slices. For example, one bit of data is read from each slice by one read operation. Similarly, for example, one bit of data is written to each slice by one write operation. The number of slices in the semiconductor storage device 100 is not limited to 64. For example, the semiconductor storage device 100 may have 32, 64, 128 or 256 slices depending on the required operating specifications.

Figure 7:
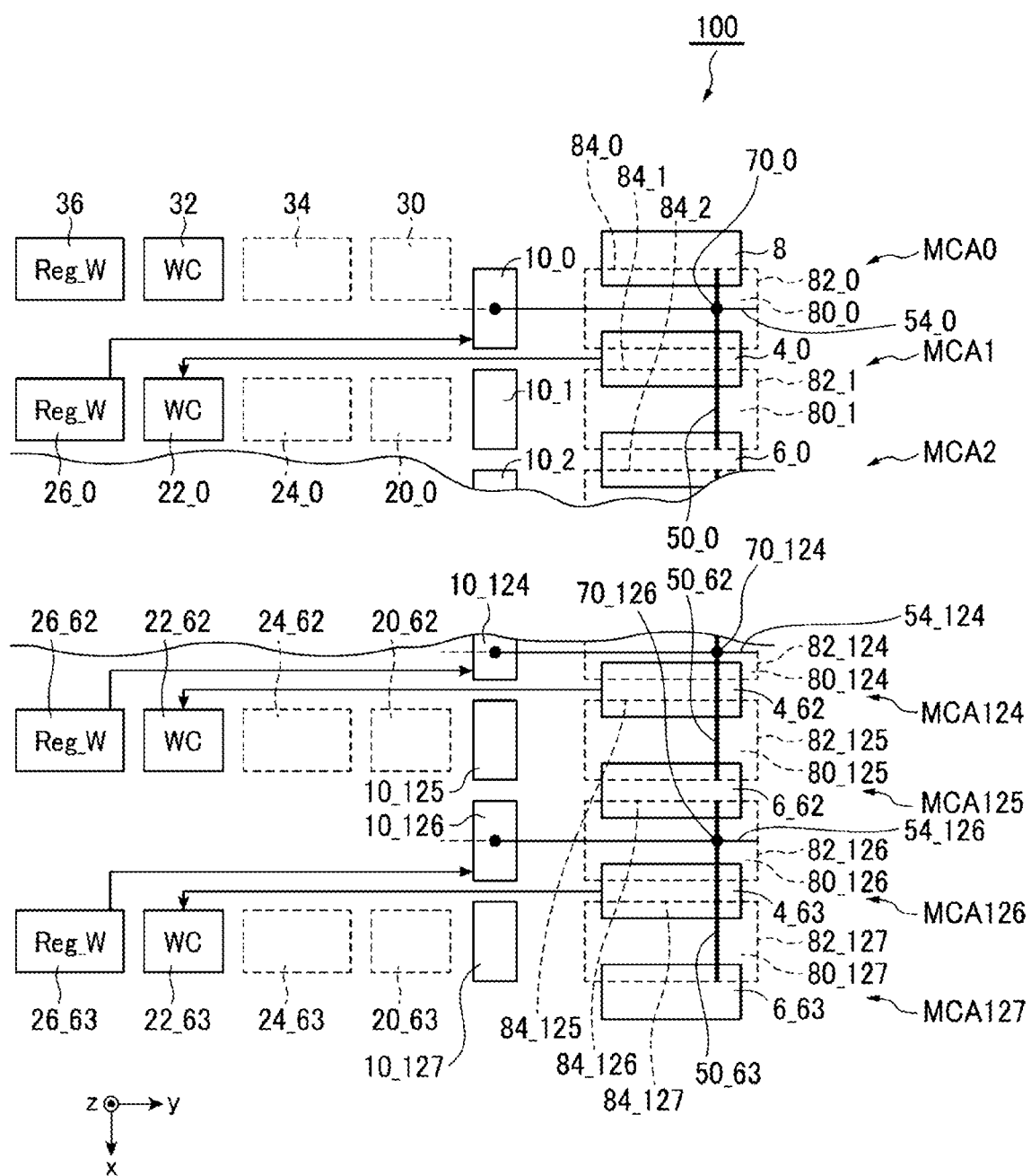
FIGS. 7-8 illustrate an example of write operations carried out in the semiconductor storage device.

FIG. 7 is a schematic view illustrating an example of the operation of the semiconductor storage device 100 according to the embodiment. FIG. 7 illustrates an example of the write operation of the memory cell provided between the BL0 and the WL0 among the memory cells belonging to each of the above-described slices.

With respect to the slices of the memory cell 70_0, the memory cell 70_1, the memory cell 72_1, and the memory cell 72_2, an example of the operation in the case of performing of writing to the memory cell 70_0 will be described. By using the multiplexer 10_0, the specific WL0 54_0 of the memory cell array MCA provided above the region 80_0 is selected. By using the multiplexer 4_0, the specific BL0 50_0 of the memory cell array MCA provided above the region 80_0 is selected. Then, writing is performed on the specific memory cell 70_0 provided between the selected specific WL0 54_0 and the selected specific BL0 50_0 described above by using the writing circuit 22_0. The value to be written is determined by the write register 26_0 connected to the multiplexer 10_0. In the case of performing of writing to the memory cell 70_1, the multiplexer 10_1 is used instead of the multiplexer 10_0.

With respect to the slices of the memory cell 70_124, the memory cell 70_125, the memory cell 72_125, and the memory cell 72_126, an example of the operation in the case of performing writing to the memory cell 70_124 will be described. By using the multiplexer 10_124, the specific WL0 54_124 of the memory cell array MCA provided above the region 80_124 is selected. By using the multiplexer 4_62, the specific BL0 50_62 of the memory cell array MCA provided above the region 80_124 described above is selected. Then, writing is performed on the specific memory cell 70_124 provided between the selected specific WL0 54_124 and the selected specific BL0 50_62 described above by using the writing circuit 22_62. The value to be written is determined by the write register 26_62 connected to the multiplexer 10_124. In the case of performing of writing to the memory cell 70_125, the multiplexer 10_125 is used instead of the multiplexer 10_124.

With respect to the slices of the memory cell 70_126, the memory cell 70_127, the memory cell 72_127, and the memory cell 72_0, an example of the operation in the case of performing writing to the memory cell 70_126 will be described. By using the multiplexer 10_126, the specific WL0 54_126 of the memory cell array MCA provided above the region 80_127 described above is selected. By using the multiplexer 4_63, the specific BL0 50_63 of the memory cell array MCA provided above the region 80_126 described above is selected. Then, writing is performed on the specific memory cell 70_126 provided between the selected specific WL0 54_126 and the selected specific BL0 50_63 described above by using the writing circuit 22_63. The value to be written is determined by the write register 26_63 connected to the multiplexer 10_126. In the case of performing of writing to the memory cell 70_127, the multiplexer 10_127 is used instead of the multiplexer 10_126.

Figure 8:
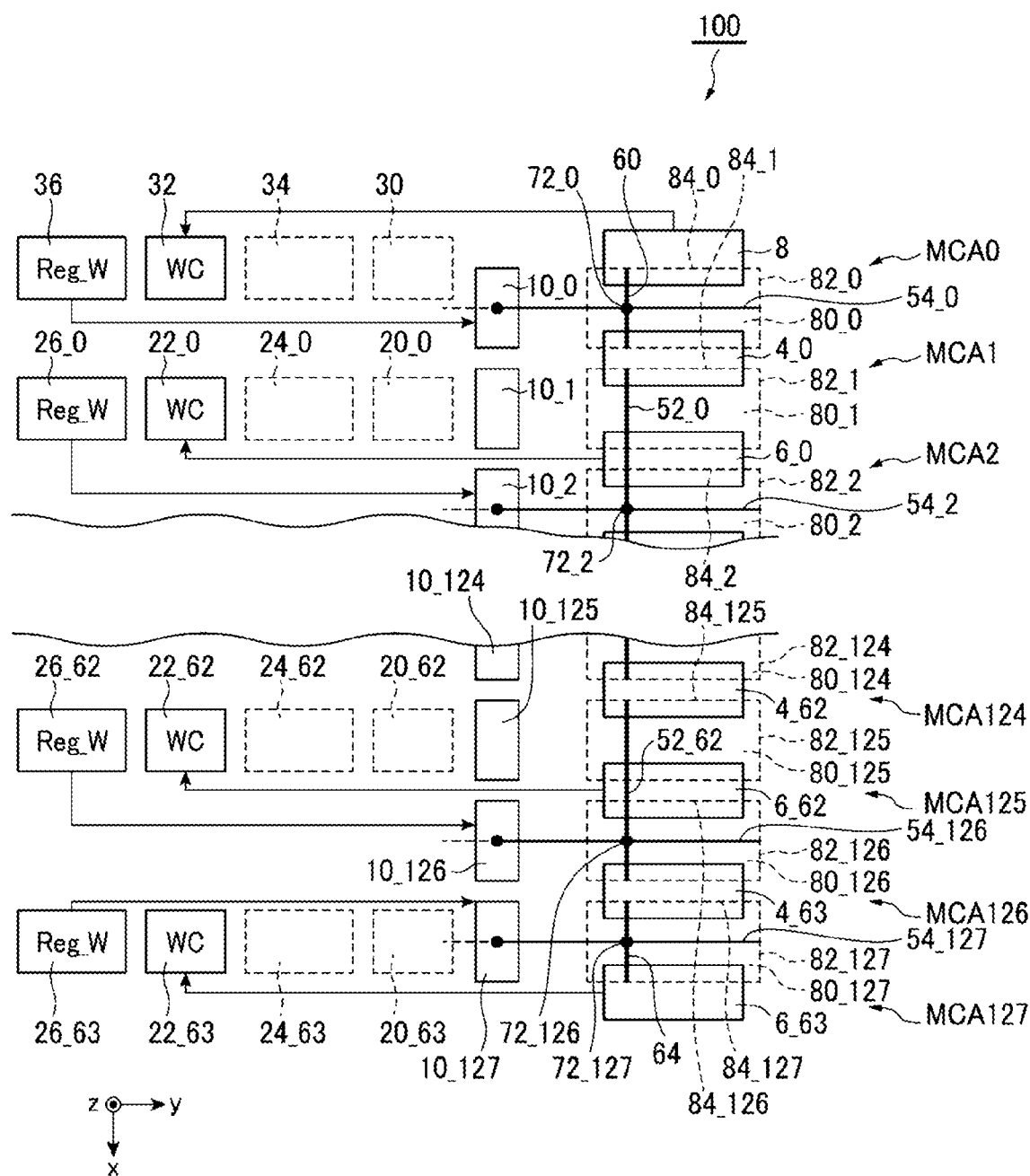

FIG. 8 is a schematic view illustrating an example of the operation of the semiconductor storage device 100 according to the embodiment. FIG. 8 illustrates an example of the write operation of the memory cell provided between the WL0 and the BL1 among the memory cells belonging to each of the above-described slices.

With respect to the slices of the memory cell 70_0, the memory cell 70_1, the memory cell 72_1, and the memory cell 72_2, an example of the operation in the case of performing writing to the memory cell 72_2 will be described. By using the multiplexer 10_2, the specific WL0 54_2 of the memory cell array MCA provided above the region 80_2 is selected. By using the multiplexer 6_0, the specific BL1 52_0 of the memory cell array MCA provided above the region 80_2 is selected. Then, writing is performed on the specific memory cell 72_2 provided between the selected specific WL0 54_2 and the selected specific BL1 52_0 described above by using the writing circuit 22_0. The value to be written is determined by the write register 26_0 connected to the multiplexer 10_2. In the case of performing of writing to the memory cell 72_1, the multiplexer 10_1 is used instead of the multiplexer 10_2.

With respect to the slices of the memory cells 70_124, the memory cells 70_125, the memory cells 72_125, and the memory cells 72_126, an example of the operation in the case of performing writing to the memory cells 72_126 will be described. By using the multiplexer 10_126, the specific WL0 54_126 of the memory cell array MCA provided above the region 80_126 is selected. By using the multiplexer 6_62, the specific BL1 52_62 of the memory cell array MCA provided above the region 80_126 is selected. Then, writing is performed on the specific memory cell 72_126 provided between the selected specific WL0 54_126 and the selected specific BL1 52_62 described above by using the writing circuit 22_62. The value to be written is determined by the write register 26_62 connected to the multiplexer 10_126. In the case of performing of writing to the memory cell 72_125, the multiplexer 10_125 is used instead of the multiplexer 10_126.

With respect to the slices of the memory cell 70_126, the memory cell 70_127, the memory cell 72_127, and the memory cell 72_0, first, an example of the operation in the case of performing writing to the memory cell 72_0 will be described. By using the multiplexer 10_0, the specific WL0 54_0 of the memory cell array MCA provided above the region 80_0 is selected. By using the multiplexer 8, the specific BL1 60 of the memory cell array MCA provided above the region 80_0 is selected. Then, writing is performed on the specific memory cell 72_0 provided between the selected specific WL0 54_0 and the selected specific BL1 60 described above by using the writing circuit 32. The value to be written is determined by the write register 36 connected to the multiplexer 10_0.

On the other hand, in the case of performing the write operation on the memory cell 72_127, by using the multiplexer 10_127, the specific WL0 54_127 of the memory cell array MCA provided above the region 80_127 is selected. By using the multiplexer 6_63, the specific BL1 64 of the memory cell array MCA provided above the region 80_127 is selected. Then, writing is performed on the specific memory cell 72_127 provided between the selected specific WL0 54_127 and the selected specific BL1 64 described above by using the writing circuit 22_63. The value to be written is determined by the write register 26_63 connected to the multiplexer 10_127. Accordingly, writing is performed on the memory cell 72_127.

That is, in the embodiment, during the performing of writing to the memory cell 72_127 or the memory cell 72_0 of the slice of the memory cell 70_126, the memory cell 70_127, the memory cell 72_127, and the memory cell 72_0, since the memory cell 72_127 and the memory cell 72_0 are not adjacent, the write register and the writing circuit are provided separately for each.

Figure 9:
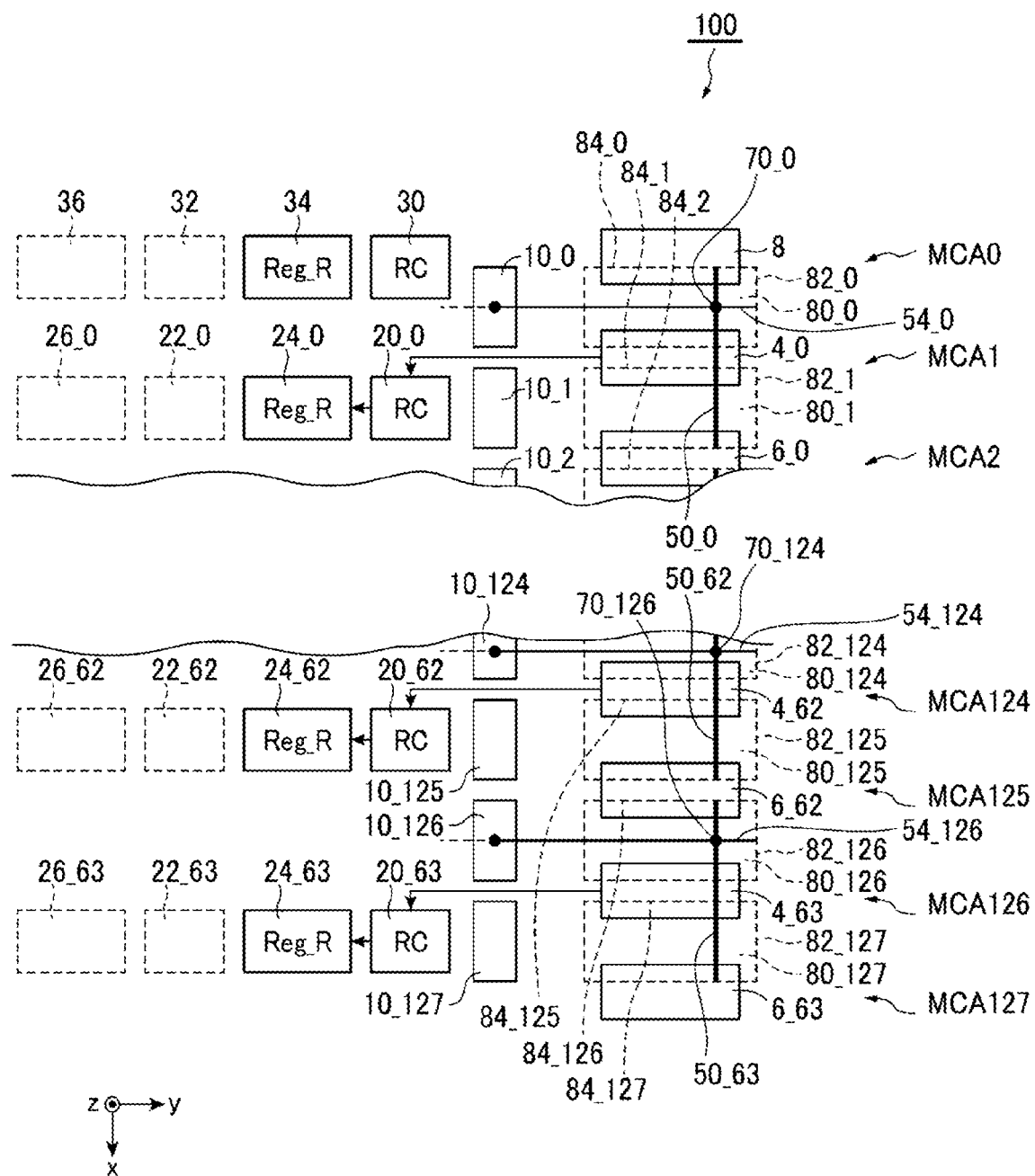
FIGS. 9-10 illustrate an example of read operations carried out in the semiconductor storage device.

FIG. 9 is a schematic view illustrating an example of the operation of the semiconductor storage device 100 according to the embodiment. FIG. 9 illustrates an example of the read operation of the memory cell provided between the BL0 and the WL0 among the memory cells belonging to each of the above-described slices.

With respect to the slices of the memory cell 70_0, the memory cell 70_1, the memory cell 72_1, and the memory cell 72_2, an example of the operation in the case of performing reading from the memory cell 70_0 will be described. By using the multiplexer 10_0, the specific WL0 54_0 of the memory cell array MCA provided above the region 80_0 is selected. By using the multiplexer 4_0, the specific BL0 50_0 of the memory cell array MCA provided above the region 80_0 is selected. Then, reading is performed on the specific memory cell 70_0 provided between the selected specific WL0 54_0 and the selected specific BL0 50_0 described above by using the reading circuit 20_0 connected to the multiplexer 4_0. The read result is stored in the read register 24_0. In the case of performing of reading from the memory cell 70_1, the multiplexer 10_1 is used instead of the multiplexer 10_0.

With respect to the slices of the memory cell 70_124, the memory cell 70_125, the memory cell 72_125, and the memory cell 72_126, an example of the operation in the case of performing reading from the memory cell 70_124 will be described. By using the multiplexer 10_124, the specific WL0 54_124 of the memory cell array MCA provided above the region 80_124 is selected. By using the multiplexer 4_62, the specific BL0 50_62 of the memory cell array MCA provided above the region 80_0 is selected. Then, reading is performed on the specific memory cell 70_124 provided between the selected specific WL0 54_124 and the selected specific BL0 50_62 described above by using the reading circuit 20_62 connected to the multiplexer 4_62. The read result is stored in the read register 24_62. In the case of performing of reading from the memory cell 70_125, the multiplexer 10_125 is used instead of the multiplexer 10_124.

With respect to the slices of the memory cell 70_126, the memory cell 70_127, the memory cell 72_127, and the memory cell 72_0, an example of the operation in the case of performing reading from the memory cell 70_126 will be described. By using the multiplexer 10_126, the specific WL0 54_126 of the memory cell array MCA provided above region 80_126 is selected. By using the multiplexer 4_63, the specific BL0 50_63 of the memory cell array MCA provided above the region 80_126 is selected. Then, reading is performed on the specific memory cell 70_126 provided between the selected specific WL0 54_126 and the selected specific BL0 50_63 described above by using the reading circuit 20_63 connected to the multiplexer 4_63. The read result is stored in the read register 24_63. In the case of performing of reading from the memory cell 70_127, the multiplexer 10_127 is used instead of the multiplexer 10_126.

Figure 10:
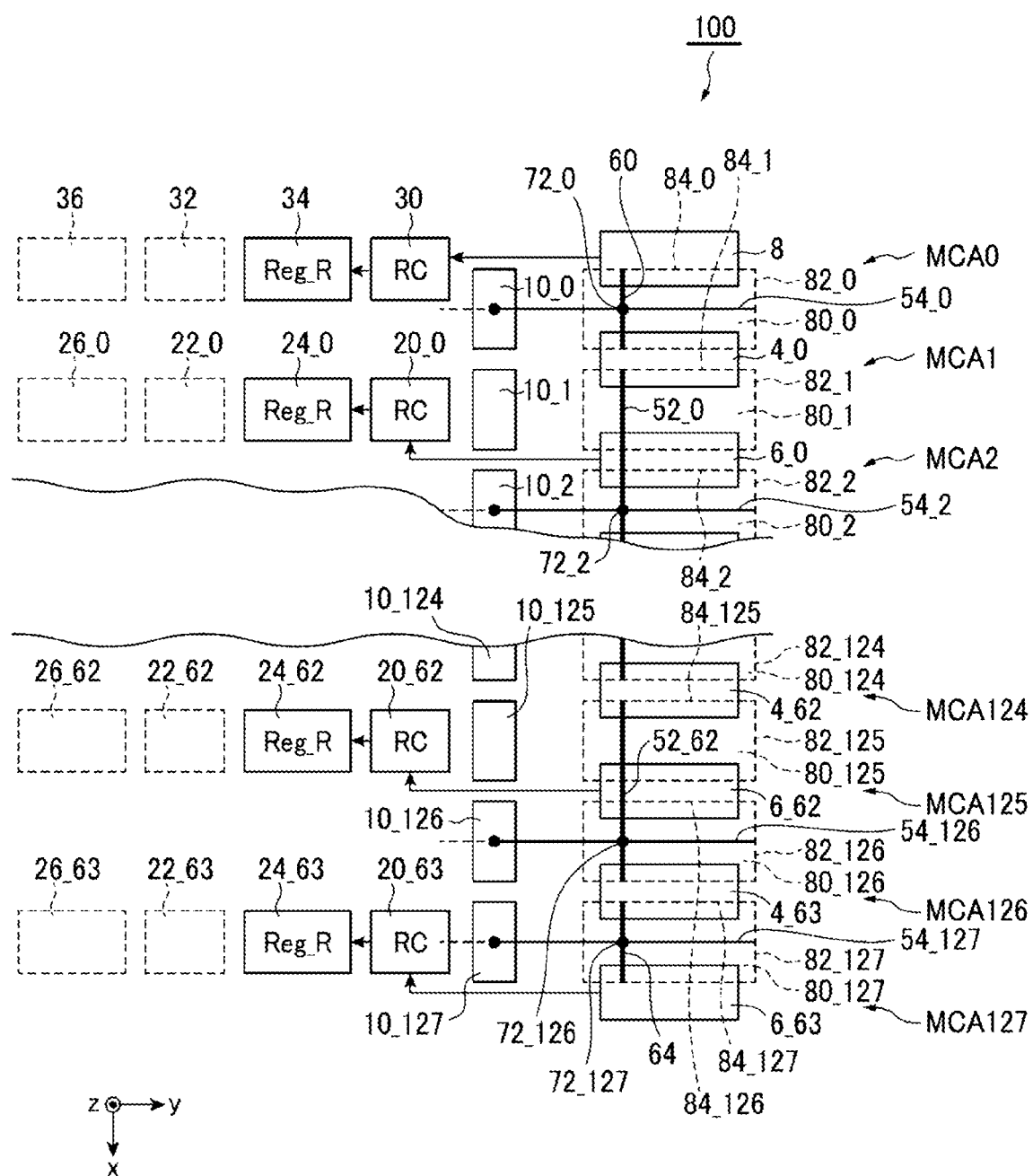

FIG. 10 is a schematic view illustrating an example of the operation of the semiconductor storage device 100 according to the embodiment. FIG. 10 illustrates an example of the read operation of the memory cell provided between the WL0 and the BL1 among the memory cells belonging to each of the above-described slices.

With respect to the slices of the memory cell 70_0, the memory cell 70_1, the memory cell 72_1, and the memory cell 72_2, an example of the operation in the case of performing reading from the memory cell 72_2 will be described. By using the multiplexer 10_2, the specific WL0 54_2 of the memory cell array MCA provided above the region 80_2 is selected. By using the multiplexer 6_0, the specific BL1 52_0 of the memory cell array MCA provided above the region 80_2 is selected. Then, reading is performed on the specific memory cell 72_2 provided between the selected specific WL0 54_2 and the selected specific BL1 52_0 described above by using the reading circuit 20_0 connected to the multiplexer 6_0. The read result is stored in the read register 24_0. In the case of performing of reading from the memory cell 72_1, the multiplexer 10_1 is used instead of the multiplexer 10_2.

With respect to the slices of the memory cells 70_124, the memory cells 70_125, the memory cells 72_125, and the memory cells 72_126, an example of the operation in the case of performing reading from the memory cells 72_126 will be described. By using the multiplexer 10_126, the specific WL0 54_126 of the memory cell array MCA provided above region 80_126 is selected. By using the multiplexer 6_62, the specific BL1 52_62 of the memory cell array MCA provided above the region 80_126 is selected. Then, reading is performed on the specific memory cell 72_126 provided between the selected specific WL0 54_126 and the selected specific BL1 52_62 described above by using the reading circuit 20_62 connected to the multiplexer 6_62. The read result is stored in the read register 24_62. In the case of performing of reading from the memory cell 72_125, the multiplexer 10_125 is used instead of the multiplexer 10_126.

With respect to the slices of the memory cell 70_126, the memory cell 70_127, the memory cell 72_127, and the memory cell 72_0, an example of the operation in the case of performing reading from the memory cell 72_0 will be described. By using the multiplexer 10_0, the specific WL0 54_0 of the memory cell array MCA provided above the region 80_0 is selected. By using the multiplexer 8, the specific BL0 60 of the memory cell array MCA provided above the region 80_0 is selected. Then, reading is performed on the specific memory cell 72_0 provided between the selected specific WL0 54_0 and the selected specific BL0 60 described above by using the reading circuit 30 connected to the multiplexer 8. The read result is stored in the read register 34.

On the other hand, in the case of performing the read operation from the memory cell 72_127, by using the multiplexer 10_127, the specific WL0 54_127 of the memory cell array MCA provided above the region 80_127 is selected. By using the multiplexer 6_63, the specific BL1 64 of the memory cell array MCA provided above the region 80_127 is selected. Then, reading is performed on the specific memory cell 72_127 provided between the selected specific WL0 54_127 and the selected specific BL1 64 described above by using the reading circuit 20_63 connected to the multiplexer 6_63. The read result is stored in the read register 24_63.

That is, in the embodiment, during the performing of reading from the memory cells 72_127 and the memory cell 72_0 of the slices of the memory cell 70_126, the memory cell 70_127, the memory cell 72_127, and the memory cell 72_0, since the memory cells 72_127 and the memory cell 72_0 are not adjacent, the read registers and the reading circuits are provided separately for each.

Figure 11:
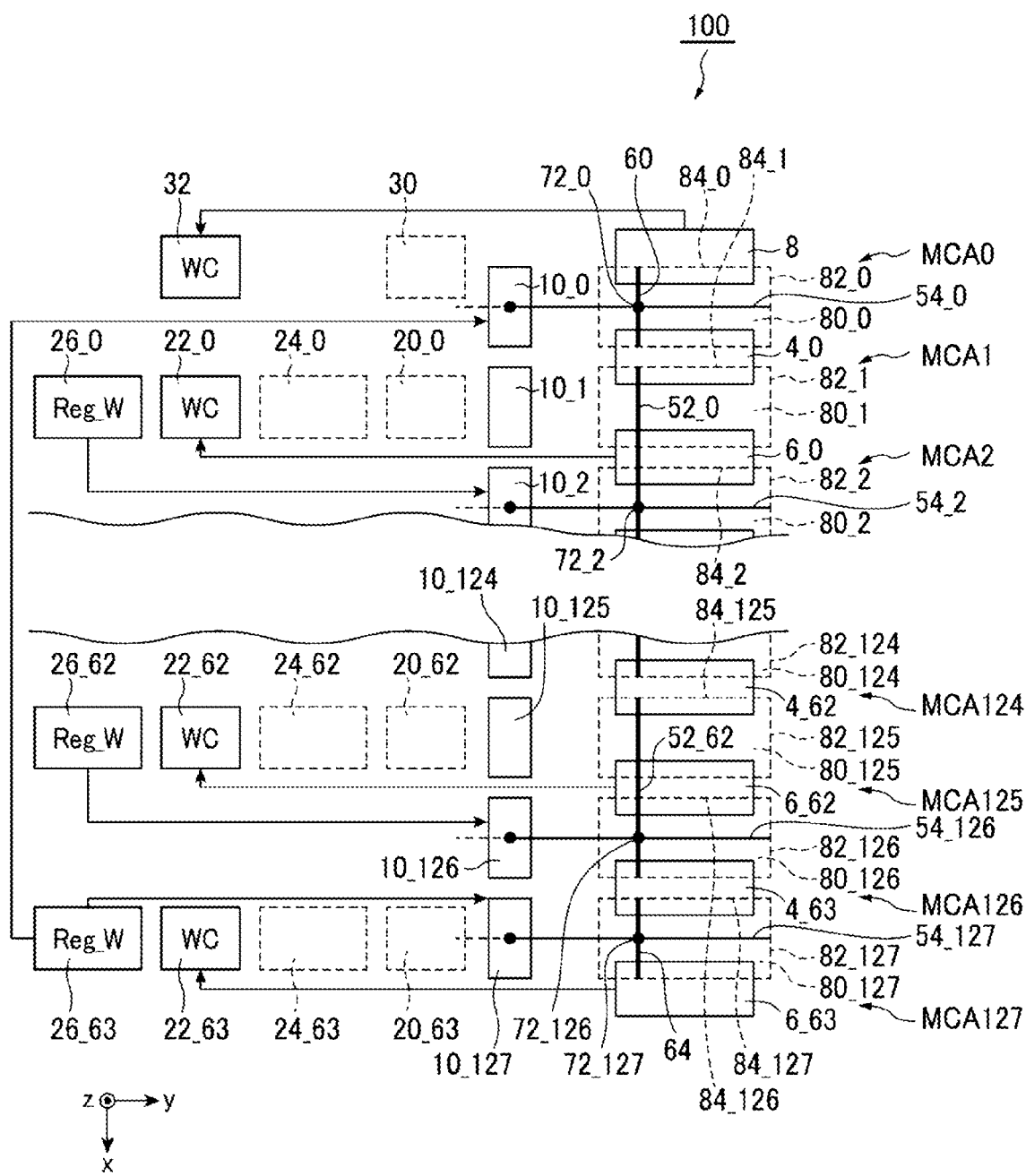
FIGS. 11-12 illustrate an example of operations carried out in a semiconductor storage device of another embodiment.

FIG. 11 is a schematic view illustrating an example of the operation of the semiconductor storage device 100 according to another embodiment. FIG. 11 illustrates an example of the write operation of the memory cell provided between the WL0 and the BL1 illustrated in FIG. 8. In this embodiment, the write register 36 is not provided. During the performing of writing to the memory cell 72_0 of the slice of the memory cell 72_0, the write register 26_63 is used.

Figure 12:
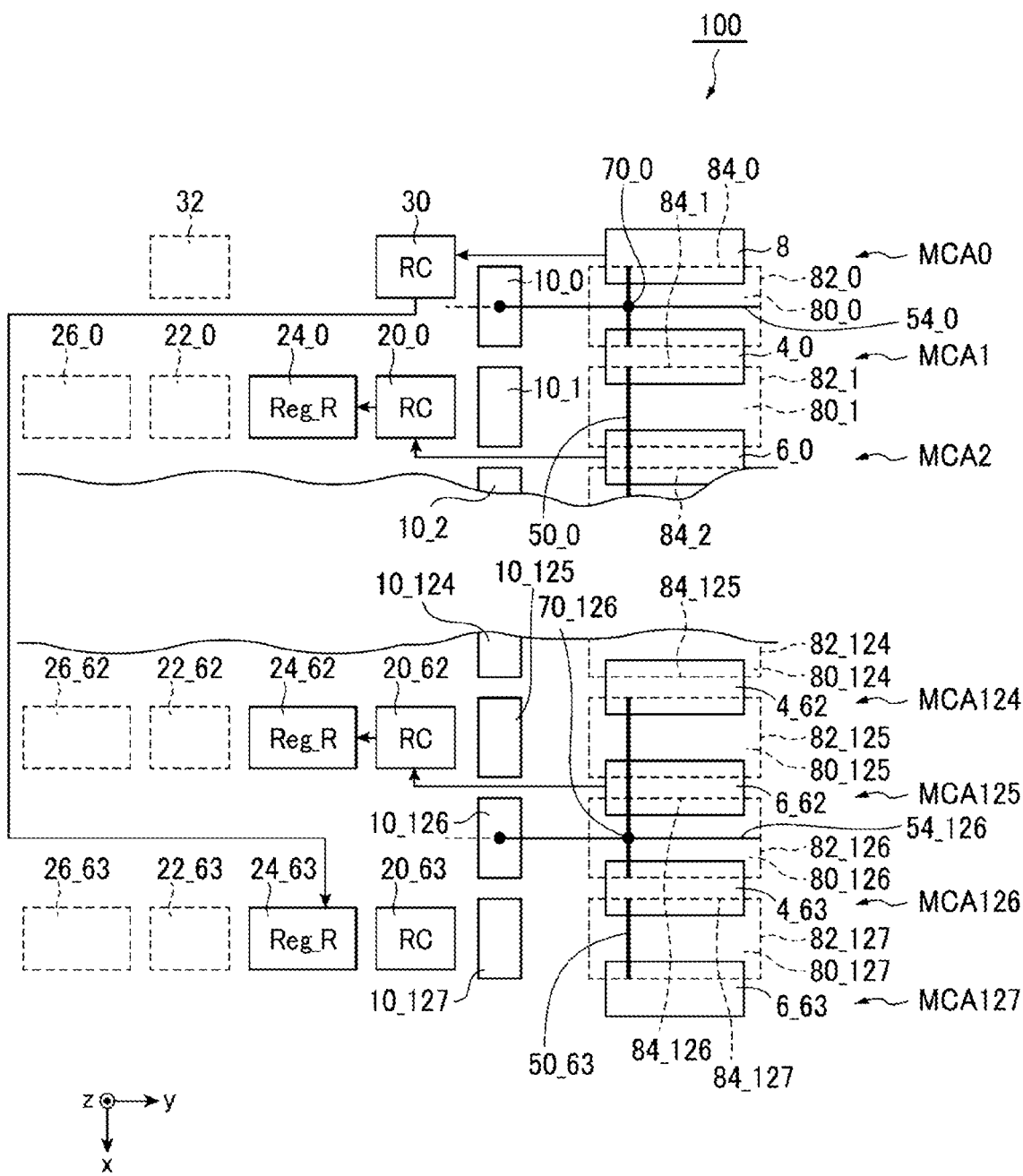

FIG. 12 is a schematic view illustrating an example of the operation of the semiconductor storage device 100 according to another embodiment. FIG. 12 illustrates an example of the read operation of the memory cell provided between the WL0 and the BL1 illustrated in FIG. 9. In this embodiment, the read register 34 is not provided. During the performing of reading from the memory cell 72_0 of the slice of the memory cell 72_0, the read register 24_63 is used.

Figure 13:
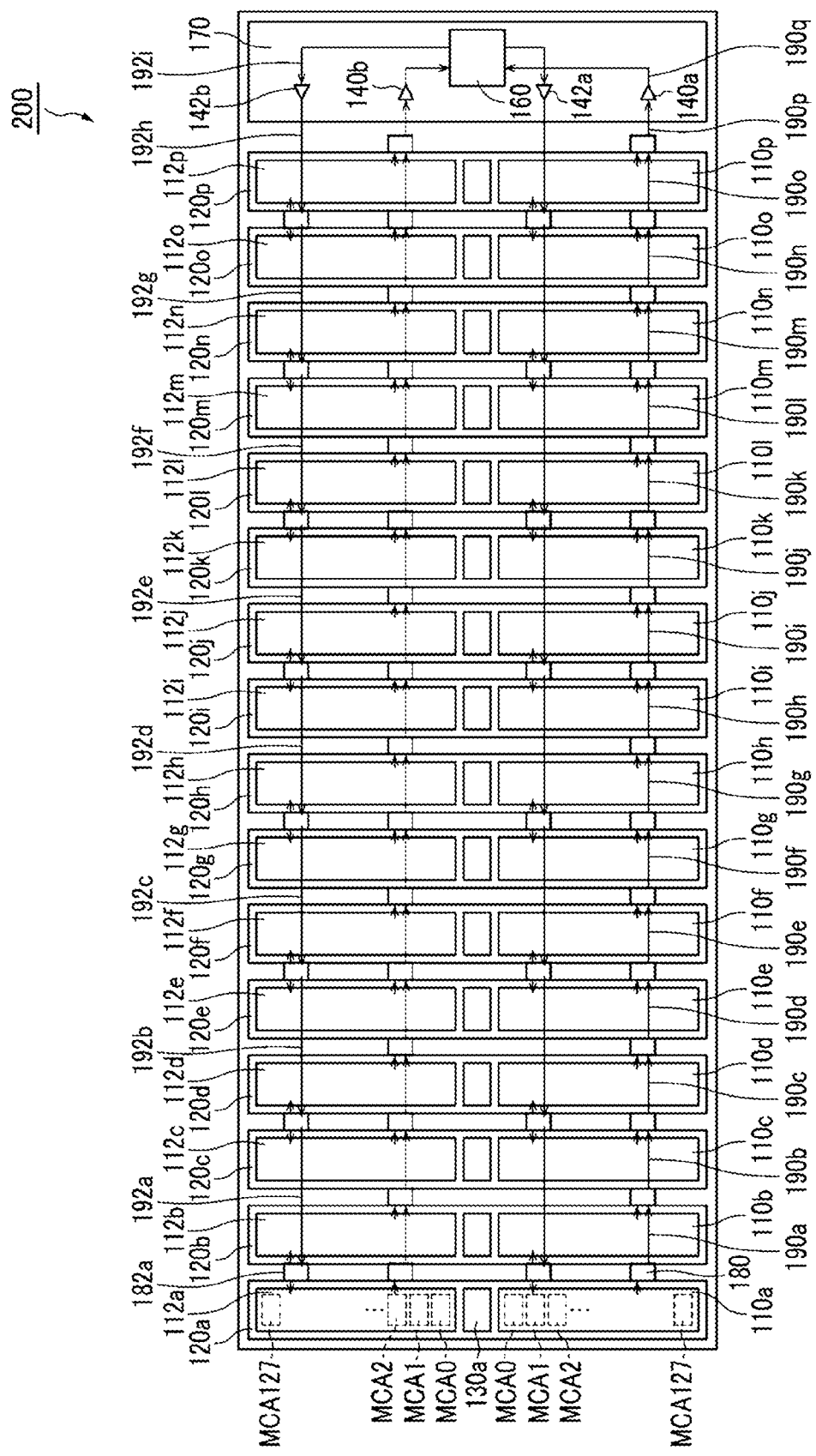
FIG. 13 is a schematic view illustrating other main portions of a semiconductor storage device according to another embodiment.

FIG. 13 is a schematic view illustrating main portions of a semiconductor storage device 200 according to another embodiment. The semiconductor storage device 200 includes banks 120. In FIG. 13, banks 120a, 120b, 120c, 120d, 120e, 120f, 120g, 120h, 120i, 120j, 120k, 120l, 120m, 120n, 120o, and 120p (collectively referred to as the banks 120) are arranged from the left to the right on the paper.

Each bank 120 has a half bank 110 and a half bank 112. In FIG. 13, half banks 110a, 110b, 110c, 110d, 110e, 110f, 110g, 110h, 110i, 110j, 110k, 110l, 110m, 110n, 110o and 110p are illustrated as the half banks 110. In FIG. 13, half banks 112a, 112b, 112c, 112d, 112e, 112f, 112g, 112h, 112i, 112j, 112k, 112l, 112m, 112n, 112o, and 112p are illustrated as the half banks 112. The half bank 110 and the half bank 112 correspond to the configurations described with reference to FIGS. 6A to 12 as the semiconductor storage device 100. In the half bank 110, the MCA0, the MCA1, the MCA2, . . . , and the MCA127 are arranged from the top to the bottom on the paper. In the half bank 112, the MCA0, the MCA1, the MCA2, . . . , and the MCA127 are arranged from the bottom to the top on the paper.

The semiconductor storage device 200 includes a peripheral circuit 170, a read data bus 190, and a write data bus 192. The peripheral circuit 170 includes a first control circuit 160, buffers 140a, 140b, and buffers 142a, 142b.

The read data bus 190 connects each half bank 110 and each half bank 112 through a logic circuit 180 provided between each half bank 110 and each half bank 112. As illustrated in FIG. 13, the read data bus 190 includes a plurality of read data buses 190a, 190b, 190c, 190d, 190e, 190f, 190g, 190h, 190i, 190j, 190k, 190l, 190m, 190n, and 190o connecting the respective half banks 110. The logic circuit 180 may further include a buffer. The read data bus 190 is connected to the first control circuit 160 via the buffer 140a or the buffer 140b. As illustrated in FIG. 13, the read data bus 190 further includes read data buses 190p and 190q connecting the above-mentioned read data buses 190a to 190o to the buffer 140a and the first control circuit 160.

The read registers 24 and the read register 34 (for example, see FIGS. 6A and 6B) provided in each half bank 110 and each half bank 112 are connected to the read data bus 190 through the logic circuit 180 provided correspondingly with the half bank 110 or the half bank 112. For example, in the case of using the semiconductor storage device 100 described with reference to FIGS. 6A to 10 as the half bank 110 or the half bank 112, since the number of read registers is 65, the read data bus 190 is capable of transferring 65 bits of data from the half bank 110 or the half bank 112 to the first control circuit 160. Then, in the case of performing reading from the slice to which the memory cells 72_127 and the memory cells 72_0 belong, the first control circuit 160 appropriately selects the read data bus 190 connected to the read register 24_63 and the read data bus 190 connected to the read register 34. On the other hand, in the case of using the semiconductor storage device 100 described with reference to FIGS. 11 and 12 as the half bank 110 or the half bank 112, since the number of read registers is 64, the read data bus 190 is capable of transferring 64 bits of data from the half bank 110 or the half bank 112 to the first control circuit 160. Then, in the case of performing reading from the slice to which the memory cells 72_127 and the memory cells 72_0 belong, the first control circuit 160 does not need to select the read data bus 190.

The write data bus 192 connects each half bank 110 and each half bank 112 through a logic circuit 182 provided between each half bank 110 and each half bank 112. As illustrated in FIG. 13, the write data bus 190 includes a plurality of write data buses 192a, 192b, 192c, 192d, 192e, and 192f connecting the respective half banks 112. The logic circuit 182 may include a buffer. The write data bus 192 is connected to the first control circuit 160 via the buffer 142a or the buffer 142b. As illustrated in FIG. 13, the write data bus 192 further includes the write data buses 192h and 192i connecting the buffer 142b and the first control circuit 160 to the above mentioned write data buses 192a to 192f.

The write registers 26 and the write register 36 (for example, see FIGS. 6A and 6B) provided in each half bank 110 and each half bank 112 are connected to the write data bus 192 through the logic circuit 182 provided correspondingly with the half bank 110 or the half bank 112. For example, in the case of using the semiconductor storage device 100 described with reference to FIGS. 6A to 10 as the half bank 110, the write data bus 192 is capable of transferring 65 bits of data from the first control circuit 160 to the half bank 110 or the half bank 112. Then, in the case of performing of writing to the slice to which the memory cells 72_127 and the memory cells 72_0 belong, the first control circuit 160 appropriately selects the write data bus 192 connected to the write register 26_63 and the write data bus 192 connected to the write register 36. On the other hand, in the case of using the semiconductor storage device 100 described with reference to FIGS. 11 and 12 as the half bank 110 or the half bank 112, since the number of registers is 64, the write data bus 192 is capable of transferring 64 bits of data from the first control circuit 160 to the half bank 110 or the half bank 112. Then, in the case of performing writing to the slice to which the memory cells 72_127 and the memory cells 72_0 belong, the first control circuit 160 does not need to select the write data bus 192.

Each bank 120 includes a second control circuit 130 between the half banks 110 and the half banks 112. In FIG.

13, the second control circuit 130a is illustrated in the bank 120a as the second control circuit 130. The second control circuit 130 is separately provided for each of the banks 120b, 120c, 120d, 120e, 120f, 120g, 120h, 120i, 120j, 120k, 120l, 120m, 120n, 120o, and 120p. The second control circuit 130 is used to control both the half bank 110 and the half bank 112 in each bank 120.

Figure 14:
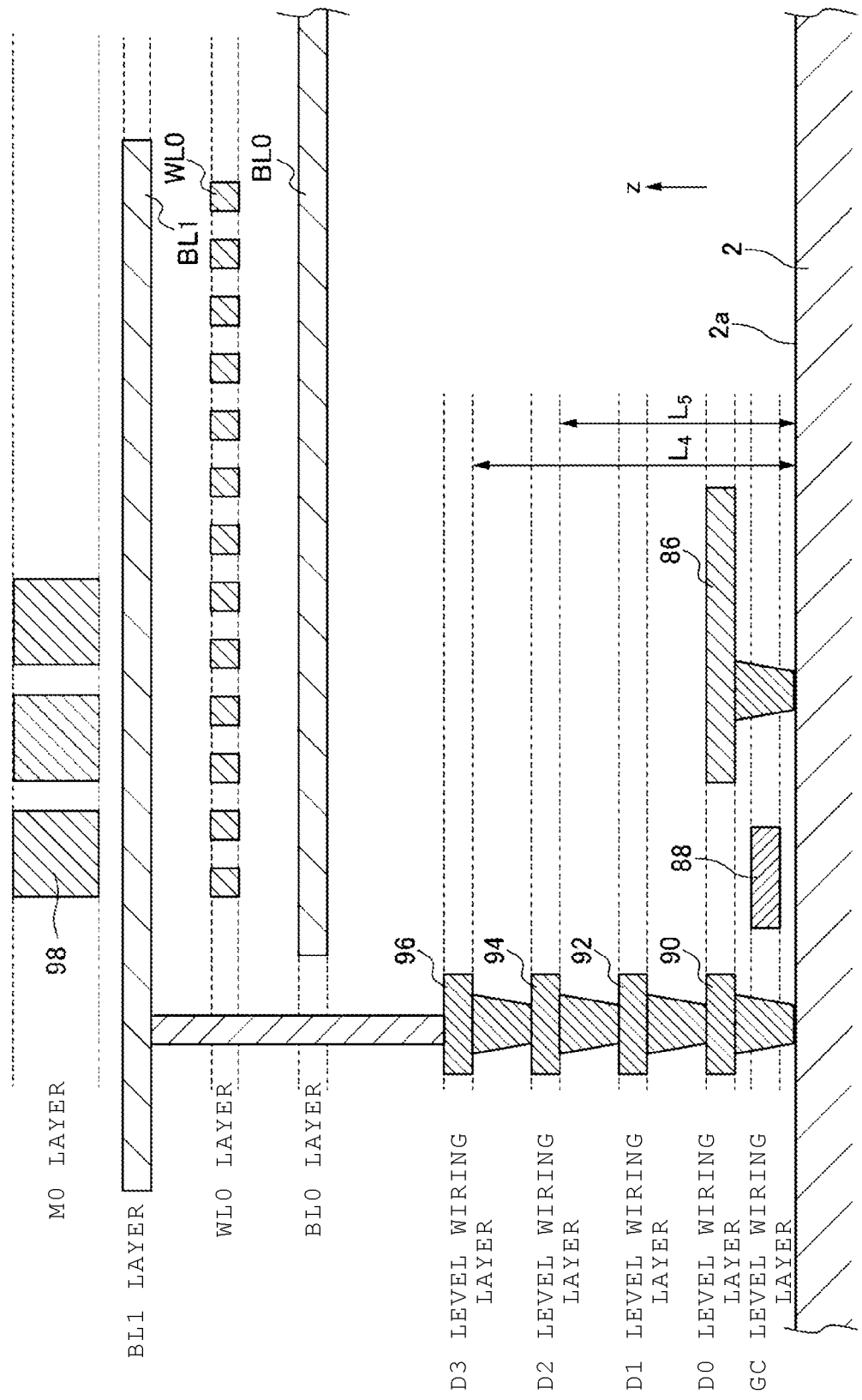
FIG. 14 is a schematic diagram illustrating a positional relationship between a substrate, connection conductors, bit lines, and word line in the embodiments.

FIG. 14 is a schematic diagram illustrating a positional relationship between a substrate, connection conductors, bit lines BL, and word lines WL in the embodiments. A GC level wiring layer, a D0 level wiring layer, a D1 level wiring layer, a D2 level wiring layer, a D3 level wiring layer, a BL0 layer, a WL0 layer, a BL1 layer, and an M0 layer are provided on the substrate 2 in this order.

The GC level wiring layer is, for example, a layer in which conductors 88 of the multiplexer 4, the multiplexer 6, and the multiplexer 10, which are connected to the gates, are arranged.

The D0 level wiring layer is, for example, a layer in which conductors 86 or conductors 90 of the multiplexer 4, the multiplexer 6, and the multiplexer 10, which are connected to the sources or the drains, are arranged.

The D1 level wiring layer, the D2 level wiring layer, and the D3 level wiring layer are, for example, layers on which wirings 92, 94, and 96 to be connected to the reading circuit 20, the writing circuit 22, the read register 24, the write register 26, the reading circuit 30, the writing circuit 32, the read register 34, or the write register 36 are arranged.

The BL0 layer, the WL0 layer, and the BL1 layer are layers on which the BL0, the WL0, and the BL1 are arranged, respectively. Since the wirings of the BL0 layer, the WL0 layer, and the BL1 layer have a regular line-and-space pattern, in order to increase the recording density by providing as many memory cells MC as possible, the wirings are formed at a high density, for example, by using a sidewall processing process. As a result, these wirings are thinner than the wiring of the GC level wiring layer, the D0 level wiring layer, the D1 level wiring layer, the D2 level wiring layer, and the D3 level wiring layer. On the other hand, with respect to the GC level wiring layer, the D0 level wiring layer, the D1 level wiring layer, the D2 level wiring layer, and the D3 level wiring layer, since the wiring layers have lower regularity than the BL0 layer, the WL0 layer, and the BL1 layer and there is little room for applying the sidewall processing process, wider wirings are arranged. For example, the thickness of the wirings of the GC level wiring layer, the D0 level wiring layer, the D1 level wiring layer, the D2 level wiring layer, and the D3 level wiring layer in the direction parallel to the substrate 2 (substrate surface 2a) is about four times the thickness of the wirings of the BL0 layer, the WL0 layer, and the BL1 layer.

The M0 layer is, for example, a layer on which a wiring 98 used for the read data bus or the write data bus is arranged. The M0 layer is provided above the BL0 layer, the WL0 layer, and the BL1 layer. Therefore, even if a size of data to be transferred through the read data bus and the write data bus becomes large, while the sizes of the read data bus and the write data bus needs to be slightly increased, it does not affect the miniaturization of the memory cell MC.

Figure 15A:
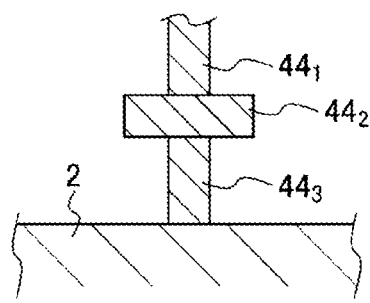
FIGS. 15A and 15B are schematic cross-sectional views illustrating an example of a shape of a connection wiring in the embodiments.
Figure 15B:
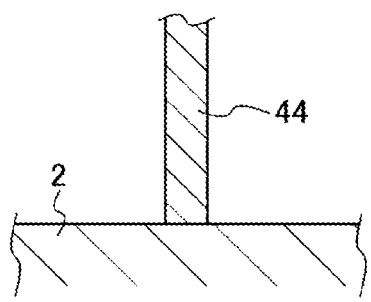

FIGS. 15A and 15B are schematic cross-sectional views illustrating an example of the shape of the connection wiring 44 in the embodiments. For example, as illustrated in FIG. 15A, the shape of the connection wiring 44 may be a shape in which a planar conductor $44_2$ is provided between the connection wiring $44_1$ and the connection wiring $44_3$. For example, as illustrated in FIG. 15B, the shape of the connection wiring 44 may be a shape in which the planar conductor $44_2$ is not provided. The shape of the connection wiring 44 of the embodiment includes both the one illustrated in FIG. 15A and the one illustrated in FIG. 15B. For example, in FIG. 15A, the number of planar conductors $44_2$ is not particularly limited.

Next, functions and effects of the semiconductor storage device 100 according to the embodiment will be described.

Figure 16A:
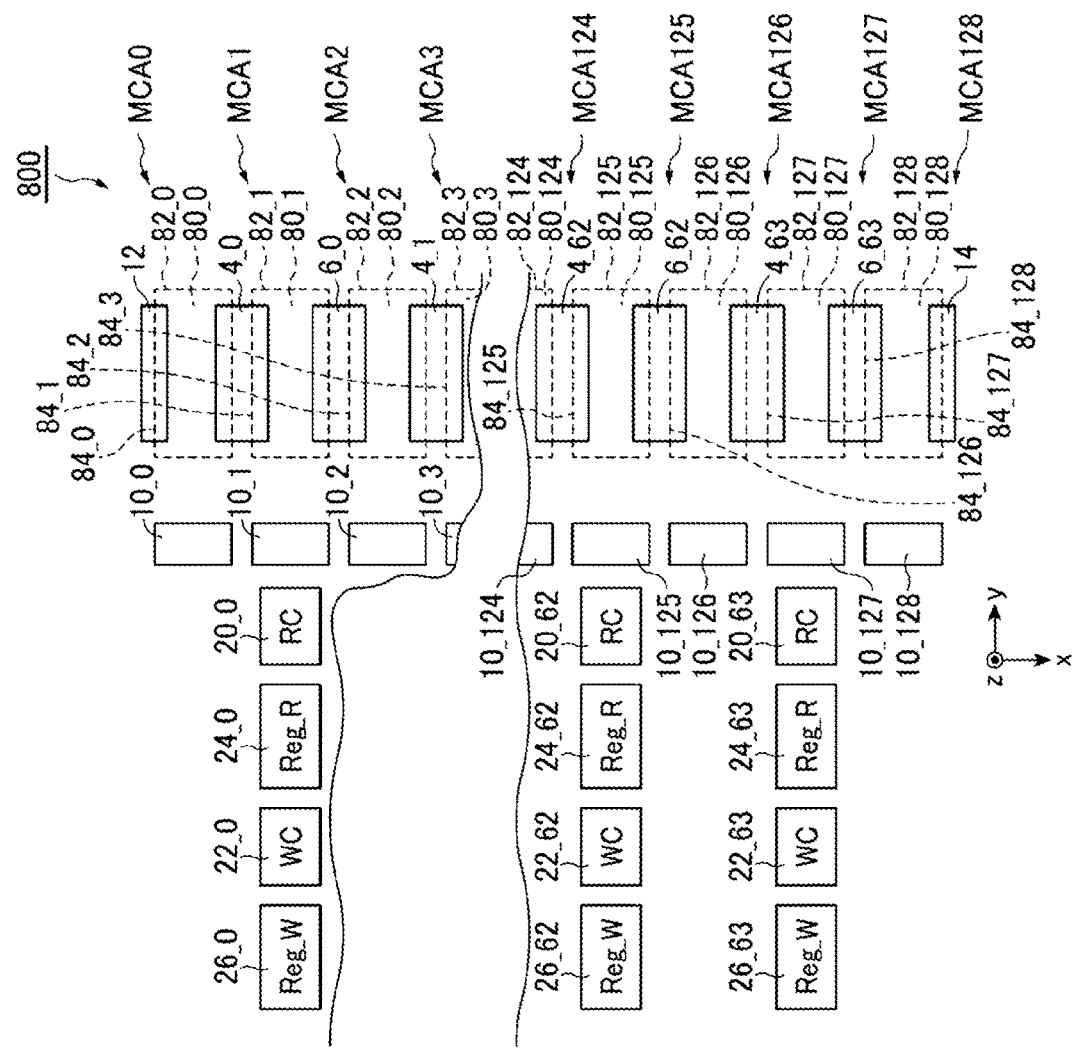
FIGS. 16A and 16B are schematic views illustrating main portions of a semiconductor storage device of a comparative example.
Figure 16B:
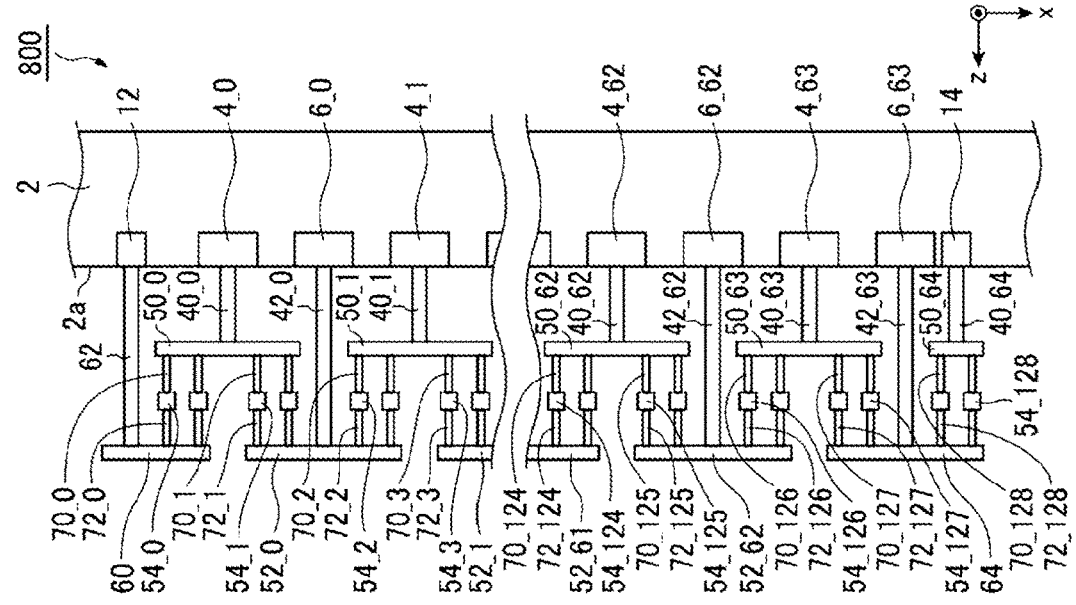

FIGS. 16A and 16B are schematic views illustrating main portions of the semiconductor storage device 800, which is a semiconductor storage device according to a comparative example. FIG. 16A is an example of a schematic cross-sectional view of the semiconductor storage device 100 in a plane perpendicular to the substrate 2. FIG. 16B is an example of a schematic view of the semiconductor storage device 100 when the substrate 2 is viewed from above.

In the semiconductor storage device 800, unlike the semiconductor storage device 100, a region 80_128 is separately provided. An MCA 128 is provided above the region 80_128. The MCA 128 includes an upper layer memory cell 70_128 and a lower layer memory cell 72_128. Each memory cell 70_128 is provided between the BL0 50_64 and the WL0 54_128. Each memory cell 72_128 is provided between the WL0 54_128 and the BL1 64 and overlaps the memory cells 70_128 when viewed from above. The WL0 54_128 is connected to the multiplexer 10_128. Then, unlike the semiconductor storage device 100, the memory cells 70_126, the memory cells 70_127, the memory cells 72_127, and the memory cells 72_128 are treated as memory cells belonging to the same slice.

Herein, the memory cells 70_128 do not belong to any of the slices, and the non-selected potential VSS is applied to these memory cells from the multiplexer 14 provided on the substrate 2 through the connection wiring 40_64. The memory cells 72_0 also do not belong to any of the slices, and the non-selected potential VSS is applied to these memory cells from the multiplexer 8 provided on the substrate 2 through the connection wiring 62 and the BL1 60. Accordingly, the memory cells 70_128 and the memory cells 72_0 are not used in the write operation and the read operation of the semiconductor storage device 800.

That is, in the semiconductor storage device 800, the region 80_128 and the memory cell array MCA128 are separately provided in order to configure 64 slices. In other words, the semiconductor storage device 800 requires a region corresponding to 129 memory cell arrays MAC in order to configure 64 slices.

On the contrary, in the semiconductor storage device 100 according to the embodiment, the MCA 128, the multiplexers 12 and 14 supplying the non-selected potential VSS, and the multiplexer 10_128 for driving the WL0 54_128 are not provided. Then, in the semiconductor storage device 100, the multiplexer 8, the reading circuit 30, the writing circuit 32, the read register 34, and the write register 36 are provided, so that the memory cell 70_126, the memory cell 70_127, the memory cell 72_127, and the memory cell 72_0 can be treated as memory cells belonging to the same slice. Accordingly, 64 slices can be achieved using the region corresponding to 128 memory cell arrays MAC. Therefore, it is possible to provide a miniaturized semiconductor storage device.

In the semiconductor storage device 100 according to the embodiment, the distance between the read register 24_0 and the read register 34 is smaller than the distance between the read register 24_0 and the read register 24_63. Similarly, the distance between the write register 26_0 and the write register 36 is smaller than the distance between the write register 26_0 and the write register 26_63. For example, during the reading from or writing in the memory cell 72_0, in the case of using the read register 24_63 or the write register 26_63 provided in the vicinity of the memory cell 70_126, the memory cell 70_127, and the memory cell 72_127, the signal line becomes long, and there is a concern that the operating speed decreases. Therefore, in the semiconductor storage device 100 according to the embodiment, in addition to the read register 24_63 and the write register 26_63 for the memory cell 70_126, the memory cell 70_127, and the memory cell 72_127, the read register 34 and the write register 36 for the memory cell 72_0 are provided. Therefore, even in a slice containing the memory cells that do not directly share a bit line, a decrease in operating speed can be prevented.

The write data bus 192 is separately connected to the write register 36, and the read data bus 190 is separately connected to the read register 34. Then, during the writing, the first control circuit 160 selects any one of the write data bus 192 connected to the write register 36 and the write data bus 192 connected to the write register 26_63 and performs writing in the write register 36 or the write register 26_63. During the reading, the first control circuit 160 selects any one of the read data bus 190 connected to the read register 34 and the read data bus 190 connected to the read register 24_63 and performs reading from the read register 34 or the read register 24_63. The reason is, since the memory cells belonging to the same slice are provided separately by the memory cell 72_0 as described above, the write data bus 192 and the read data bus 190 connected to the write register 36 and the read register 34 are separately provided, and the write data bus 192 and the read data bus 190 are selected by the first control circuit 160. As described with reference to FIG. 14, the write data bus 192 and the read data bus 190 are provided in the M0 layer above the BL0 layer, the WL0 layer, and the BL1 layer in which the memory cell array MCA is provided. Therefore, even if the read data bus 190 and the write data bus 192 connected to the write register 36 and the read register 34 are separately provided, the miniaturization of the semiconductor storage device 100 is not hindered.

The length $L_1$ of the region including the reading circuit 20_0, the reading circuit 30, the writing circuit 22_0, the writing circuit 32, the read register 24_0, the read register 34, the write register 26_0, and the write register 36 in the x direction of the substrate surface 2a is larger than the length $L_2$ of the region including the reading circuit 24_62, the writing circuit 22_62, the read register 24_62, and the write register 26_62 in the x direction of the substrate surface 2a. The reason is, the reading circuit 30, the writing circuit 32, the read register 34, and the write register 36 are separately provided.

As described with reference to FIGS. 11 and 12, the read register 34 and the write register 36 may not be provided. Here, the write register 26_63 is connected to the multiplexer 10_0. The read register 24_63 is connected to the reading circuit 30. Accordingly, the write data bus 192 connected to the write register 36 and the read data bus 190 connected to the read register 34 are also not provided.

In the case of a configuration including the plurality of semiconductor storage devices 100 and the second control circuit 130, it is preferable that the second control circuit 130 is provided between the plurality of semiconductor storage devices 100. This is, for example, in a configuration including a semiconductor storage device 100a, a semiconductor storage device 100b, and a second control circuit 130, in the case of a configuration in which the semiconductor storage device 100a, the semiconductor storage device 100b, and the second control circuit 130 are arranged side by side in this order, the length of the wiring connecting the memory cell provided in the semiconductor storage device 100a and the second control circuit 130 is larger than the length of the wiring connecting the semiconductor storage device 100b and the second control circuit 130. Therefore, the operation of the memory cell provided in the semiconductor storage device 100a becomes slower than the operation of the memory cell provided in the semiconductor storage device 100b, and thus, a variation in operating speed occurs. Therefore, in order to avoid such a variation in operating speed, it is preferable that the second control circuit 130 is provided between the plurality of semiconductor storage devices 100.

While certain embodiments have been described, these embodiments have been presented by way of example only, and are not intended to limit the scope of the disclosure. Indeed, the novel apparatus and methods described herein may be embodied in a variety of other forms; furthermore, various omissions, substitutions and changes in the form of the apparatus and methods described herein may be made without departing from the spirit of the disclosure. The accompanying claims and their equivalents are intended to cover such forms or modifications as would fall within the scope and spirit of the disclosure.

What is claimed is:

1. A semiconductor storage device comprising:
   a plurality of lower bit lines extending in a first direction, the lower bit lines including first and second outer lower bit lines and a plurality of inner lower bit lines between the first and second outer lower bit lines;
   a plurality of word lines extending in a second direction crossing the first direction, and spaced from the plurality of lower bit lines in a third direction crossing the first and second directions, the word lines including first, second, and third word lines that are adjacent, and fourth and fifth word lines that are adjacent;
   a plurality of upper bit lines extending in the first direction, and spaced from the plurality of word lines in the third direction, the upper bit lines including first and second outer upper bit lines and a plurality of inner upper bit lines between the first and second outer upper bit lines, the inner upper bit lines including a first inner upper bit line adjacent to the first outer upper bit line and a second inner upper bit line adjacent to the second outer upper bit line;
   a memory cell array including a plurality of memory cells electrically connected between the lower bit lines and the word lines and between the upper bit lines and the word lines, the plurality of memory cells including a plurality of logical slices of memory cells, wherein
   a memory cell from each of the logical slices is selected when carrying out a read operation or a write operation on the memory cell array, and the logical slices of memory cells include first and second logical slices,
   the first logical slice including
      a first memory cell electrically connected between the first outer lower bit line and the first word line,
      a second memory cell electrically connected between the first outer lower bit line and the second word line,
      a third memory cell electrically connected between the first inner upper bit line and the second word line, and
      a fourth memory cell electrically connected between the first inner upper bit line and the third word line, and the second logical slice including
a fifth memory cell electrically connected between the second outer lower bit line and the fourth word line,
a sixth memory cell electrically connected between the second outer lower bit line and the fifth word line,
a seventh memory cell electrically connected between the second outer upper bit line and the fifth word line, and
an eighth memory cell electrically connected between the first outer upper bit line and the first word line.

2. The semiconductor storage device according to claim 1, wherein
a selected bit line voltage is applied to the first outer upper bit line when the eighth memory cell is selected as the memory cell of the second logical slice to which data is to be written, and to the second outer upper bit line when the seventh memory cell is selected as the memory cell of the second logical slice to which data is to be written; and
a selected word line voltage is applied to the first word line when the eighth memory cell is selected as the memory cell of the second logical slice to which data is to be written, and to the fifth word line when the seventh memory cell is selected as the memory cell of the second logical slice to which data is to be written.

3. The semiconductor storage device according to claim 2, further comprising:
a first write register in which the data to be written to the selected memory cell is stored when the selected memory cell is the eighth memory cell;
a first write circuit configured to write the data stored in the first write register to the eighth memory cell;
a second write register in which the data to be written to the selected memory cell is stored when the selected memory cell is the seventh memory cell; and
a second write circuit configured to write the data stored in the second write register to the seventh memory cell.

4. The semiconductor storage device according to claim 2, further comprising:
a write register in which the data to be written to the selected memory cell of the second logical slice is stored;
a first write circuit configured to write the data stored in the write register to the eighth memory cell; and
a second write circuit configured to write the data stored in the write register to the seventh memory cell.

5. The semiconductor storage device according to claim 1, wherein
a selected bit line voltage is applied to the first outer upper bit line when the eighth memory cell is selected as the memory cell of the second logical slice from which data is to be read, and to the second outer upper bit line when the seventh memory cell is selected as the memory cell of the second logical slice from which data is to be read; and
a selected word line voltage is applied to the first word line when the eighth memory cell is selected as the memory cell of the second logical slice from which data is to be read, and to the fifth word line when the seventh memory cell is selected as the memory cell of the second logical slice from which data is to be read.

6. The semiconductor storage device according to claim 5, further comprising:
a first read circuit configured to read the data from the eighth memory cell when the selected memory cell is the eighth memory cell;
a first read register in which the data read from the eighth memory cell is stored by the first read circuit;
a second read circuit configured to read the data from the seventh memory cell when the selected memory cell is the seventh memory cell; and
a second read register in which the data read from the seventh memory cell is stored by the second read circuit.

7. The semiconductor storage device according to claim 5, further comprising:
a read register in which the data read from the selected memory cell of the second logical slice is stored;
a first read circuit configured to read the data from the eighth memory cell and store the data in the read register when the selected memory cell is the eighth memory cell; and
a second read circuit configured to read the data from the seventh memory cell and store the data in the read register when the selected memory cell is the seventh memory cell.

8. The semiconductor storage device according to claim 1, wherein
the plurality of lower bit lines are spaced apart in the first direction; and
the plurality of upper bit lines are spaced apart in the first direction.

9. The semiconductor storage device according to claim 1, wherein
the number of word lines electrically connected to each of the lower bit lines and the inner upper bit lines is the same, and
the number of word lines electrically connected to each of the first and second outer upper bit lines is one-half of the number of word lines electrically connected to each of the lower bit lines and the inner upper bit lines.

10. The semiconductor storage device according to claim 1, further comprising:
a first multiplexer circuit configured to supply a selected bit line voltage to the first outer upper bit line when the eighth memory cell is selected as the memory cell of the second logical slice from which data is to be read or to which data is to be written; and
a second multiplexer circuit configured to supply the selected bit line voltage to the second outer upper bit line when the seventh memory cell is selected as the memory cell of the second logical slice from which data is to be read or to which data is to be written.

11. The semiconductor storage device according to claim 10, further comprising:
a third multiplexer circuit configured to supply a selected word line voltage to the first word line when the eighth memory cell is selected as the memory cell of the second logical slice from which data is to be read or to which data is to be written; and
a fourth multiplexer circuit configured to supply the selected word line voltage to the fifth word line when the seventh memory cell is selected as the memory cell of the second logical slice from which data is to be read or to which data is to be written.

12. A method of performing a write operation in a semiconductor storage device comprising:
a plurality of lower bit lines extending in a first direction, the lower bit lines including first and second outer lower bit lines and a plurality of inner lower bit lines between the first and second outer lower bit lines;
a plurality of word lines extending in a second direction crossing the first direction, and spaced from the plurality of lower bit lines in a third direction crossing the first and second directions, the word lines including first, second, and third word lines that are adjacent, and fourth and fifth word lines that are adjacent;

a plurality of upper bit lines extending in the first direction, and spaced from the plurality of word lines in the third direction, the upper bit lines including first and second outer upper bit lines and a plurality of inner upper bit lines between the first and second outer upper bit lines, the inner upper bit lines including a first inner upper bit line adjacent to the first outer upper bit line and a second inner upper bit line adjacent to the second outer upper bit line; and a memory cell array including a plurality of memory cells electrically connected between the lower bit lines and the word lines and between the upper bit lines and the word lines, the plurality of memory cells including a plurality of logical slices of memory cells, said method comprising selecting a memory cell from each of the logical slices, wherein the logical slices of memory cells include first and second logical slices, the first logical slice including a first memory cell electrically connected between the first outer lower bit line and the first word line, a second memory cell electrically connected between the first outer lower bit line and the second word line, a third memory cell electrically connected between the first inner upper bit line and the second word line, and a fourth memory cell electrically connected between the first inner upper bit line and the third word line, and the second logical slice including a fifth memory cell electrically connected between the second outer lower bit line and the fourth word line, a sixth memory cell electrically connected between the second outer lower bit line and the fifth word line, a seventh memory cell electrically connected between the second outer upper bit line and the fifth word line, and an eighth memory cell electrically connected between the first outer upper bit line and the first word line, and applying a selected bit line voltage to the first outer upper bit line when the eighth memory cell is selected as the memory cell of the second logical slice to which data is to be written and to the second outer upper bit line when the seventh memory cell is selected as the memory cell of the second logical slice to which data is to be written.

13. The method according to claim 12, further comprising:

applying a selected word line voltage to the first word line when the eighth memory cell is selected as the memory cell of the second logical slice to which data is to be written and to the fifth word line when the seventh memory cell is selected as the memory cell of the second logical slice to which data is to be written.

14. The method according to claim 13, further comprising:

storing the data to be written in a first write register when the selected memory cell is the eighth memory cell and in a second write register when the selected memory cell is the seventh memory cell.

15. The method according to claim 13, further comprising:

storing the data to be written in a write register when the selected memory cell is either the seventh memory cell or the eighth memory cell.

16. A method of performing a read operation in a semiconductor storage device comprising:

a plurality of lower bit lines extending in a first direction, the lower bit lines including first and second outer lower bit lines and a plurality of inner lower bit lines between the first and second outer lower bit lines;

a plurality of word lines extending in a second direction crossing the first direction, and spaced from the plurality of lower bit lines in a third direction crossing the first and second directions, the word lines including first, second, and third word lines that are adjacent, and fourth and fifth word lines that are adjacent;

a plurality of upper bit lines extending in the first direction, and spaced from the plurality of word lines in the third direction, the upper bit lines including first and second outer upper bit lines and a plurality of inner upper bit lines between the first and second outer upper bit lines, the inner upper bit lines including a first inner upper bit line adjacent to the first outer upper bit line and a second inner upper bit line adjacent to the second outer upper bit line; and a memory cell array including a plurality of memory cells electrically connected between the lower bit lines and the word lines and between the upper bit lines and the word lines, the plurality of memory cells including a plurality of logical slices of memory cells, said method comprising selecting a memory cell from each of the logical slices, wherein the logical slices of memory cells include first and second logical slices, the first logical slice including a first memory cell electrically connected between the first outer lower bit line and the first word line, a second memory cell electrically connected between the first outer lower bit line and the second word line, a third memory cell electrically connected between the first inner upper bit line and the second word line, and a fourth memory cell electrically connected between the first inner upper bit line and the third word line, and the second logical slice including a fifth memory cell electrically connected between the second outer lower bit line and the fourth word line, a sixth memory cell electrically connected between the second outer lower bit line and the fifth word line, a seventh memory cell electrically connected between the second outer upper bit line and the fifth word line, and an eighth memory cell electrically connected between the first outer upper bit line and the first word line, and applying a selected bit line voltage to the first outer upper bit line when the eighth memory cell is selected as the memory cell of the second logical slice from which data is to be read and to the second outer upper bit line when the seventh memory cell is selected as the memory cell of the second logical slice from which data is to be read.

17. The method according to claim 16, further comprising:

applying a selected word line voltage to the first word line when the eighth memory cell is selected as the memory cell of the second logical slice from which data is to be read and to the fifth word line when the seventh memory cell is selected as the memory cell of the second logical slice from which data is to be read.

18. The method according to claim 17, further comprising:

storing the data read from the selected memory cell in a first read register when the selected memory cell is the eighth memory cell and in a second read register when the selected memory cell is the seventh memory cell.

19. The method according to claim 17, further comprising:

storing the data read from the selected memory cell in a read register when the selected memory cell is either the seventh memory cell or the eighth memory cell.

* * * * *